(12) United States Patent
Tung et al.

(10) Patent No.: US 7,405,863 B2
(45) Date of Patent: Jul. 29, 2008

(54) PATTERNING OF MECHANICAL LAYER IN MEMS TO REDUCE STRESSES AT SUPPORTS

(75) Inventors: Ming-Hau Tung, San Francisco, CA (US); Wonsuk Chung, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/445,529

(22) Filed: Jun. 1, 2006

(65) Prior Publication Data

US 2007/0279753 A1    Dec. 6, 2007

(51) Int. Cl.
G02B 26/00    (2006.01)
G02F 1/03     (2006.01)

(52) U.S. Cl. .................................... 359/291; 359/245
(58) Field of Classification Search .................. 359/291
See application file for complete search history.

(56) References Cited

U.S. PATENT DOCUMENTS

| 2,534,846 | A | 12/1950 | Ambrose et al. |
|---|---|---|---|
| 3,439,973 | A | 4/1969 | Paul et al. |
| 3,443,854 | A | 5/1969 | Weiss |
| 3,616,312 | A | 10/1971 | McGriff et al. |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,813,265 | A | 5/1974 | Marks |
| 3,955,880 | A | 5/1976 | Lierke |
| 4,099,854 | A | 7/1978 | Decker et al. |
| 4,196,396 | A | 4/1980 | Smith |
| 4,228,437 | A | 10/1980 | Shelton |
| 4,377,324 | A | 3/1983 | Durand et al. |
| 4,389,096 | A | 6/1983 | Hori et al. |
| 4,392,711 | A | 7/1983 | Moraw et al. |
| 4,403,248 | A | 9/1983 | Te Velde |
| 4,441,791 | A | 4/1984 | Hornbeck |
| 4,445,050 | A | 4/1984 | Marks |
| 4,459,182 | A | 7/1984 | te Velde |
| 4,482,213 | A | 11/1984 | Piliavin et al. |

(Continued)

FOREIGN PATENT DOCUMENTS

CH        681 047      12/1992

(Continued)

OTHER PUBLICATIONS

Akasaka, "Three-Dimensional IC Trends," Proceedings of IEEE, vol. 74, No. 12, pp. 1703-1714, (Dec. 1986).

(Continued)

*Primary Examiner*—Jordan M. Schwartz
*Assistant Examiner*—James C Jones
(74) *Attorney, Agent, or Firm*—Knobbe Martens Olson & Bear LLP

(57) ABSTRACT

A method of fabricating a MEMS device includes the formation of support posts having horizontal wing portions at the edges of the post. A mechanical layer is deposited over the support posts and portions of the mechanical layer overlying portions of the support post other than the horizontal wing portions are etched away. A resultant MEMS device includes a mechanical layer overlying at least a portion of the horizontal wing portions of the underlying support structures.

22 Claims, 15 Drawing Sheets

U.S. PATENT DOCUMENTS

| | | | |
|---|---|---|---|
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | Te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A * | 5/1991 | Hornbeck ................ 438/23 |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,287,215 A | 2/1994 | Warde et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoads et al. |
| 5,619,366 A | 4/1997 | Rhoads et al. |
| 5,622,814 A | 4/1997 | Miyata et al. |
| 5,629,790 A | 5/1997 | Neukermans et al. |
| 5,633,652 A | 5/1997 | Kanbe et al. |
| 5,636,052 A | 6/1997 | Arney et al. |

| | | | | | | |
|---|---|---|---|---|---|---|
| 5,636,185 | A | 6/1997 | Brewer et al. | 6,232,936 B1 | 5/2001 | Gove et al. |
| 5,638,084 | A | 6/1997 | Kalt | 6,243,149 B1 | 6/2001 | Swanson et al. |
| 5,638,946 | A | 6/1997 | Zavracky | 6,246,398 B1 | 6/2001 | Koo |
| 5,641,391 | A | 6/1997 | Hunter et al. | 6,249,039 B1 | 6/2001 | Harvey et al. |
| 5,646,768 | A | 7/1997 | Kaeriyama | 6,282,010 B1 | 8/2001 | Sulzbach et al. |
| 5,647,819 | A | 7/1997 | Fujita et al. | 6,284,560 B1 | 9/2001 | Jech et al. |
| 5,650,834 | A | 7/1997 | Nakagawa et al. | 6,295,154 B1 | 9/2001 | Laor et al. |
| 5,650,881 | A | 7/1997 | Hornbeck | 6,323,982 B1 | 11/2001 | Hornbeck |
| 5,654,741 | A | 8/1997 | Sampsell et al. | 6,327,071 B1 | 12/2001 | Kimura et al. |
| 5,657,099 | A | 8/1997 | Doherty et al. | 6,329,297 B1 | 12/2001 | Balish et al. |
| 5,659,374 | A | 8/1997 | Gale, Jr. et al. | 6,335,831 B2 | 1/2002 | Kowarz et al. |
| 5,665,997 | A | 9/1997 | Weaver et al. | 6,351,329 B1 | 2/2002 | Greywal |
| 5,673,139 | A | 9/1997 | Johnson | 6,356,254 B1 | 3/2002 | Kimura |
| 5,674,757 | A | 10/1997 | Kim | 6,376,787 B1 | 4/2002 | Martin et al. |
| 5,683,591 | A | 11/1997 | Offenberg | 6,391,675 B1 | 5/2002 | Ehmke et al. |
| 5,703,710 | A | 12/1997 | Brinkman et al. | 6,392,233 B1 | 5/2002 | Channin et al. |
| 5,706,022 | A | 1/1998 | Hato | 6,392,781 B1 | 5/2002 | Kim et al. |
| 5,710,656 | A | 1/1998 | Goosen | 6,407,851 B1 | 6/2002 | Islam et al. |
| 5,726,480 | A | 3/1998 | Pister | 6,447,126 B1 | 9/2002 | Hornbeck |
| 5,739,945 | A | 4/1998 | Tayebati | 6,452,465 B1 | 9/2002 | Brown et al. |
| 5,745,193 | A | 4/1998 | Urbanus et al. | 6,456,420 B1 | 9/2002 | Goodwin-Johansson |
| 5,745,281 | A | 4/1998 | Yi et al. | 6,465,355 B1 | 10/2002 | Horsley |
| 5,771,116 | A | 6/1998 | Miller et al. | 6,466,354 B1 | 10/2002 | Gudeman |
| 5,771,321 | A | 6/1998 | Stern | 6,466,358 B2 | 10/2002 | Tew |
| 5,784,189 | A | 7/1998 | Bozler et al. | 6,473,274 B1 | 10/2002 | Maimone et al. |
| 5,784,190 | A | 7/1998 | Worley | 6,480,177 B2 | 11/2002 | Doherty et al. |
| 5,784,212 | A | 7/1998 | Hornbeck | 6,496,122 B2 | 12/2002 | Sampsell |
| 5,793,504 | A | 8/1998 | Stoll | 6,513,911 B1 | 2/2003 | Ozaki et al. |
| 5,808,780 | A | 9/1998 | McDonald | 6,522,801 B1 | 2/2003 | Aksyuk et al. |
| 5,818,095 | A | 10/1998 | Sampsell | 6,531,945 B1 | 3/2003 | Ahn et al. |
| 5,822,110 | A | 10/1998 | Dabbaj | 6,537,427 B1 | 3/2003 | Raina et al. |
| 5,822,170 | A | 10/1998 | Cabuz et al. | 6,545,335 B1 | 4/2003 | Chua et al. |
| 5,824,608 | A | 10/1998 | Gotoch et al. | 6,548,908 B2 | 4/2003 | Chua et al. |
| 5,825,528 | A | 10/1998 | Goosen | 6,549,338 B1 | 4/2003 | Wolverton et al. |
| 5,835,255 | A | 11/1998 | Miles | 6,552,840 B2 | 4/2003 | Knipe |
| 5,838,484 | A | 11/1998 | Goosen | 6,574,033 B1 | 6/2003 | Chui et al. |
| 5,842,088 | A | 11/1998 | Thompson | 6,577,785 B1 | 6/2003 | Spahn et al. |
| 5,867,302 | A | 2/1999 | Fleming | 6,589,625 B1 | 7/2003 | Kothari et al. |
| 5,912,758 | A | 6/1999 | Knipe et al. | 6,600,201 B2 | 7/2003 | Hartwell et al. |
| 5,914,803 | A | 6/1999 | Hwang et al. | 6,602,791 B2 | 8/2003 | Ouellet et al. |
| 5,920,421 | A | 7/1999 | Choi | 6,606,175 B1 | 8/2003 | Sampsell et al. |
| 5,943,155 | A | 8/1999 | Goossen | 6,608,268 B1 | 8/2003 | Goldsmith |
| 5,943,158 | A | 8/1999 | Ford et al. | 6,610,440 B1 | 8/2003 | LaFollette et al. |
| 5,959,763 | A | 9/1999 | Bozler et al. | 6,625,047 B2 | 9/2003 | Coleman, Jr., deceased |
| 5,972,193 | A | 10/1999 | Chou et al. | 6,630,786 B2 | 10/2003 | Cummings et al. |
| 5,976,902 | A | 11/1999 | Shih | 6,632,698 B2 | 10/2003 | Ives |
| 5,978,127 | A | 11/1999 | Berg | 6,635,919 B1 | 10/2003 | Melendez et al. |
| 5,986,796 | A | 11/1999 | Miles | 6,642,913 B1 | 11/2003 | Kimura et al. |
| 6,016,693 | A | 1/2000 | Viani et al. | 6,643,069 B2 | 11/2003 | Dewald |
| 6,028,690 | A | 2/2000 | Carter et al. | 6,650,455 B2 | 11/2003 | Miles |
| 6,031,653 | A | 2/2000 | Yu | 6,653,997 B2 | 11/2003 | Van Gorkom et al. |
| 6,038,056 | A | 3/2000 | Florence et al. | 6,657,832 B2 | 12/2003 | Williams et al. |
| 6,040,937 | A | 3/2000 | Miles | 6,666,561 B1 | 12/2003 | Blakley |
| 6,049,317 | A | 4/2000 | Thompson et al. | 6,674,033 B1 | 1/2004 | Chui et al. |
| 6,055,090 | A | 4/2000 | Miles | 6,674,562 B1 | 1/2004 | Miles et al. |
| 6,057,903 | A | 5/2000 | Colgan et al. | 6,677,225 B1 | 1/2004 | Ellis et al. |
| 6,061,075 | A | 5/2000 | Nelson et al. | 6,680,792 B2 | 1/2004 | Miles |
| 6,097,145 | A | 8/2000 | Kastalsky et al. | 6,687,896 B1 | 3/2004 | Miles |
| 6,099,132 | A | 8/2000 | Kaeriyama | 6,710,908 B2 | 3/2004 | Miles et al. |
| 6,100,477 | A | 8/2000 | Randall et al. | 6,720,267 B1 | 4/2004 | Chen et al. |
| 6,100,872 | A | 8/2000 | Aratani et al. | 6,736,987 B1 | 5/2004 | Cho |
| 6,113,239 | A | 9/2000 | Sampsell et al. | 6,741,377 B2 | 5/2004 | Miles |
| 6,115,326 | A | 9/2000 | Puma et al. | 6,741,384 B1 | 5/2004 | Martin et al. |
| 6,147,790 | A | 11/2000 | Meier et al. | 6,741,503 B1 | 5/2004 | Farris et al. |
| 6,158,156 | A | 12/2000 | Patrick | 6,743,570 B2 | 6/2004 | Harnett et al. |
| 6,160,833 | A | 12/2000 | Floyd et al. | 6,747,785 B2 | 6/2004 | Chen et al. |
| 6,166,422 | A | 12/2000 | Qian et al. | 6,747,800 B1 | 6/2004 | Lin |
| 6,170,332 | B1 | 1/2001 | MacDonald et al. | 6,756,317 B2 | 6/2004 | Sniegowski et al. |
| 6,180,428 | B1 | 1/2001 | Peeters et al. | 6,760,146 B2 | 7/2004 | Ikeda et al. |
| 6,194,323 | B1 | 2/2001 | Downey et al. | 6,768,097 B1 | 7/2004 | Vikorovitch et al. |
| 6,195,196 | B1 | 2/2001 | Kimura et al. | 6,775,174 B2 | 8/2004 | Huffman et al. |
| 6,201,633 | B1 | 3/2001 | Peeters et al. | 6,778,155 B2 | 8/2004 | Doherty et al. |
| 6,204,080 | B1 | 3/2001 | Hwang | 6,778,306 B2 | 8/2004 | Sniegowski et al. |

| | | |
|---|---|---|
| 6,788,175 B1 | 9/2004 | Prophet |
| 6,794,119 B2 | 9/2004 | Miles |
| 6,811,267 B1 | 11/2004 | Allen et al. |
| 6,812,482 B2 | 11/2004 | Fleming et al. |
| 6,819,469 B1 | 11/2004 | Koba |
| 6,822,628 B2 | 11/2004 | Dunphy et al. |
| 6,829,132 B2 | 12/2004 | Martin et al. |
| 6,853,129 B1 | 2/2005 | Cummings et al. |
| 6,855,610 B2 | 2/2005 | Tung et al. |
| 6,859,218 B1 | 2/2005 | Luman et al. |
| 6,859,301 B1 | 2/2005 | Islam et al. |
| 6,861,277 B1 | 3/2005 | Monroe et al. |
| 6,862,022 B2 | 3/2005 | Slupe |
| 6,862,029 B1 | 3/2005 | D'Souza et al. |
| 6,867,896 B2 | 3/2005 | Miles |
| 6,870,581 B2 | 3/2005 | Li et al. |
| 6,870,654 B2 | 3/2005 | Lin et al. |
| 6,882,458 B2 | 4/2005 | Lin et al. |
| 6,882,461 B1 | 4/2005 | Tsai et al. |
| 6,912,022 B2 | 6/2005 | Lin et al. |
| 6,940,631 B2 | 9/2005 | Ishikawa |
| 6,952,303 B2 | 10/2005 | Lin et al. |
| 6,952,304 B2 | 10/2005 | Mushika et al. |
| 6,958,847 B2 | 10/2005 | Lin |
| 6,967,757 B1 | 11/2005 | Allen et al. |
| 6,980,350 B2 | 12/2005 | Hung et al. |
| 6,982,820 B2 | 1/2006 | Tsai |
| 6,987,432 B2 | 1/2006 | Lutz et al. |
| 6,995,890 B2 | 2/2006 | Lin |
| 7,006,272 B2 | 2/2006 | Tsai |
| 7,016,095 B2 | 3/2006 | Lin |
| 7,016,099 B2 | 3/2006 | Ikeda et al. |
| 7,027,202 B1 | 4/2006 | Hunter et al. |
| 7,042,643 B2 | 5/2006 | Miles |
| 7,078,293 B2 | 7/2006 | Lin et al. |
| 7,110,158 B2 | 9/2006 | Miles |
| 7,119,945 B2 | 10/2006 | Kothari et al. |
| 7,123,216 B1 | 10/2006 | Miles |
| 7,161,730 B2 | 1/2007 | Floyd |
| 7,193,768 B2 | 3/2007 | Lin |
| 7,198,973 B2 | 4/2007 | Lin et al. |
| 7,233,029 B2 | 6/2007 | Mochizuki |
| 7,250,315 B2 | 7/2007 | Miles |
| 2001/0003487 A1 | 6/2001 | Miles |
| 2001/0010953 A1 | 8/2001 | Kang et al. |
| 2001/0026951 A1 | 10/2001 | Vergani et al. |
| 2001/0040649 A1 | 11/2001 | Ozaki |
| 2001/0040675 A1 | 11/2001 | True et al. |
| 2001/0055208 A1 | 12/2001 | Kimura |
| 2002/0015215 A1 | 2/2002 | Miles |
| 2002/0021485 A1 | 2/2002 | Pilossof |
| 2002/0024711 A1 | 2/2002 | Miles |
| 2002/0031155 A1 | 3/2002 | Tayebati et al. |
| 2002/0036304 A1 | 3/2002 | Ehmke et al. |
| 2002/0054424 A1 | 5/2002 | Miles |
| 2002/0055253 A1 | 5/2002 | Rudhard |
| 2002/0058422 A1 | 5/2002 | Jang et al. |
| 2002/0071169 A1 | 6/2002 | Bowers et al. |
| 2002/0075555 A1 | 6/2002 | Miles |
| 2002/0086455 A1 | 7/2002 | Franosch et al. |
| 2002/0109899 A1 | 8/2002 | Ohtaka et al. |
| 2002/0110948 A1 | 8/2002 | Huang et al. |
| 2002/0126364 A1 | 9/2002 | Miles |
| 2002/0131682 A1 | 9/2002 | Nasiri et al. |
| 2002/0135857 A1 | 9/2002 | Fitzpatrick et al. |
| 2002/0137072 A1 | 9/2002 | Mirkin et al. |
| 2002/0149828 A1 | 10/2002 | Miles |
| 2002/0168136 A1 | 11/2002 | Atia et al. |
| 2002/0195681 A1 | 12/2002 | Melendez et al. |
| 2003/0006468 A1 | 1/2003 | Ma et al. |
| 2003/0036215 A1 | 2/2003 | Reid |
| 2003/0043157 A1 | 3/2003 | Miles |
| 2003/0054588 A1 | 3/2003 | Patel et al. |
| 2003/0062186 A1 | 4/2003 | Boroson et al. |
| 2003/0072070 A1 | 4/2003 | Miles |
| 2003/0090350 A1 | 5/2003 | Feng et al. |
| 2003/0091072 A1 | 5/2003 | Wang et al. |
| 2003/0112096 A1 | 6/2003 | Potter |
| 2003/0119221 A1 | 6/2003 | Cunningham et al. |
| 2003/0123126 A1 | 7/2003 | Meyer et al. |
| 2003/0138213 A1 | 7/2003 | Jiin et al. |
| 2003/0152872 A1 | 8/2003 | Miles |
| 2003/0201784 A1 | 10/2003 | Potter |
| 2003/0202264 A1 | 10/2003 | Weber et al. |
| 2003/0202265 A1 | 10/2003 | Reboa et al. |
| 2003/0202266 A1 | 10/2003 | Ring et al. |
| 2003/0231373 A1 | 12/2003 | Kowarz et al. |
| 2004/0010115 A1 | 1/2004 | Sotzing |
| 2004/0027636 A1 | 2/2004 | Miles |
| 2004/0027701 A1 | 2/2004 | Ishikawa |
| 2004/0028849 A1 | 2/2004 | Stark et al. |
| 2004/0035821 A1 | 2/2004 | Doan et al. |
| 2004/0051929 A1 | 3/2004 | Sampsell et al. |
| 2004/0053434 A1 | 3/2004 | Bruner |
| 2004/0058531 A1 | 3/2004 | Miles et al. |
| 2004/0058532 A1 | 3/2004 | Miles et al. |
| 2004/0061543 A1 | 4/2004 | Nam et al. |
| 2004/0063322 A1 | 4/2004 | Yang |
| 2004/0070813 A1 | 4/2004 | Aubuchon |
| 2004/0080807 A1 | 4/2004 | Chen et al. |
| 2004/0087086 A1 | 5/2004 | Lee |
| 2004/0100677 A1 | 5/2004 | Huibers et al. |
| 2004/0124073 A1 | 7/2004 | Pilans et al. |
| 2004/0125281 A1 | 7/2004 | Lin et al. |
| 2004/0125282 A1 | 7/2004 | Lin et al. |
| 2004/0125536 A1 | 7/2004 | Arney et al. |
| 2004/0136076 A1 | 7/2004 | Parviz |
| 2004/0145049 A1 | 7/2004 | McKinnell et al. |
| 2004/0145811 A1 | 7/2004 | Lin et al. |
| 2004/0147056 A1 | 7/2004 | McKinnell et al. |
| 2004/0147198 A1 | 7/2004 | Lin et al. |
| 2004/0148009 A1 | 7/2004 | Buzzard |
| 2004/0150869 A1 | 8/2004 | Kasai |
| 2004/0160143 A1 | 8/2004 | Shreeve et al. |
| 2004/0174583 A1 | 9/2004 | Chen et al. |
| 2004/0175577 A1 | 9/2004 | Lin et al. |
| 2004/0179281 A1 | 9/2004 | Reboa |
| 2004/0179445 A1 | 9/2004 | Park |
| 2004/0191937 A1 | 9/2004 | Patel et al. |
| 2004/0207497 A1 | 10/2004 | Hsu et al. |
| 2004/0207897 A1 | 10/2004 | Lin |
| 2004/0209192 A1 | 10/2004 | Lin et al. |
| 2004/0209195 A1 | 10/2004 | Lin |
| 2004/0212026 A1 | 10/2004 | Van Brocklin et al. |
| 2004/0217378 A1 | 11/2004 | Martin et al. |
| 2004/0217919 A1 | 11/2004 | Pichl et al. |
| 2004/0218251 A1 | 11/2004 | Piehl et al. |
| 2004/0218334 A1 | 11/2004 | Martin et al. |
| 2004/0218341 A1 | 11/2004 | Martin et al. |
| 2004/0227493 A1 | 11/2004 | Van Brocklin et al. |
| 2004/0233498 A1 | 11/2004 | Starkweather et al. |
| 2004/0240027 A1 | 12/2004 | Lin et al. |
| 2004/0240032 A1 | 12/2004 | Miles |
| 2004/0240138 A1 | 12/2004 | Martin et al. |
| 2004/0245588 A1 | 12/2004 | Nikkel et al. |
| 2004/0263944 A1 | 12/2004 | Miles et al. |
| 2005/0001828 A1 | 1/2005 | Martin et al. |
| 2005/0003667 A1 | 1/2005 | Lin et al. |
| 2005/0020089 A1 | 1/2005 | Shi et al. |
| 2005/0024557 A1 | 2/2005 | Lin |
| 2005/0035699 A1 | 2/2005 | Tsai |
| 2005/0036095 A1 | 2/2005 | Yeh et al. |
| 2005/0036192 A1 | 2/2005 | Lin et al. |
| 2005/0038950 A1 | 2/2005 | Adelmann |
| 2005/0042117 A1 | 2/2005 | Lin |
| 2005/0046919 A1 | 3/2005 | Taguchi et al. |

| | | | |
|---|---|---|---|
| 2005/0046922 A1 | 3/2005 | Lin et al. | |
| 2005/0046948 A1 | 3/2005 | Lin | |
| 2005/0057442 A1 | 3/2005 | Way | |
| 2005/0068583 A1 | 3/2005 | Gutkowski et al. | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1 | 4/2005 | Lin | |
| 2005/0128565 A1 | 6/2005 | Ljungblad | |
| 2005/0168849 A1 | 8/2005 | Lin | |
| 2005/0195454 A1 | 9/2005 | Faase et al. | |
| 2005/0195462 A1 | 9/2005 | Lin | |
| 2005/0195467 A1 | 9/2005 | Kothari et al. | |
| 2005/0202649 A1 | 9/2005 | Hung et al. | |
| 2005/0249966 A1 | 11/2005 | Tung et al. | |
| 2006/0006138 A1 | 1/2006 | Lin | |
| 2006/0018348 A1 | 1/2006 | Przybyla et al. | |
| 2006/0024880 A1 | 2/2006 | Chui et al. | |
| 2006/0066511 A1 | 3/2006 | Chui | |
| 2006/0066932 A1 | 3/2006 | Chui | |
| 2006/0066935 A1 | 3/2006 | Cummings et al. | |
| 2006/0066936 A1 | 3/2006 | Chui et al. | |
| 2006/0076311 A1 | 4/2006 | Tung et al. | |
| 2006/0077502 A1 | 4/2006 | Tung et al. | |
| 2006/0077518 A1 | 4/2006 | Chui et al. | |
| 2006/0079048 A1 | 4/2006 | Sampsell et al. | |
| 2006/0119922 A1* | 6/2006 | Faase et al. | 359/290 |
| 2006/0203325 A1* | 9/2006 | Faase et al. | 359/290 |
| 2006/0256420 A1 | 11/2006 | Miles et al. | |
| 2007/0019280 A1 | 1/2007 | Sasagawa et al. | |
| 2007/0019923 A1 | 1/2007 | Sasagawa et al. | |
| 2007/0041076 A1* | 2/2007 | Zhong et al. | 359/290 |
| 2007/0041703 A1 | 2/2007 | Wang | |
| 2007/0042524 A1 | 2/2007 | Kogut et al. | |
| 2007/0064760 A1 | 3/2007 | Kragh | |
| 2007/0096300 A1 | 5/2007 | Wang et al. | |
| 2007/0170540 A1 | 7/2007 | Chung et al. | |
| 2007/0247401 A1 | 10/2007 | Sasagawa et al. | |
| 2007/0249079 A1 | 10/2007 | Sasagawa et al. | |

FOREIGN PATENT DOCUMENTS

| | | |
|---|---|---|
| CN | 092109265 | 11/2003 |
| DE | 10228946 A1 | 1/2004 |
| DE | 198 47 455 | 4/2004 |
| EP | 0 069 226 | 1/1983 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0878824 A2 | 11/1998 |
| EP | 1197778 | 4/2002 |
| EP | 1258860 A1 | 11/2002 |
| EP | 1 452 481 A | 9/2004 |
| FR | 2824643 | 10/1999 |
| JP | 405275401 A | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002 062493 | 2/2002 |
| JP | 2002-207182 | 7/2002 |
| JP | 2002-270575 | 9/2002 |
| JP | 2002-341267 | 11/2002 |
| JP | 2002-355800 | 12/2002 |
| JP | 2003001598 A | 1/2003 |
| JP | 2003-215475 | 7/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |
| WO | WO 2006/036542 | 4/2006 |

OTHER PUBLICATIONS

Austrian Search Report dated May 4, 2005.
Austrian Search Report dated Aug. 12, 2005.
Aratani et al., "Surface micromachined tuneable interferometer array," Sensors and Actuators, pp. 17-23. (1994).
Conner, "Hybrid Color Display Using Optical Interference Filter Array," SID Digest, pp. 577-580 (1993).
EP 05255661.0 European Search Report (Dec. 30, 2005).
Fan et al., "Channel Drop Filters in Photonic Crystals," Optics Express, vol. 3, No. 1 (1998).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.
Gosch, "West Germany Grabs the Lead in X-Ray Lithography," Electronics pp. 78-80 (Feb. 5, 1987).
Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.
Howard et al., "Nanometer-Scale Fabrication Techniques," VLSI Electronics: Microstructure Science, vol. 5, pp. 145-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics," John Wiley & Sons Inc., pp. 568-573, date unknown.
Jerman et al., "A Miniature Fabry-Perot Interferometer with a Corrugated Silicon Diaphragm Support," (1988).
Joannopoulos et al., "Photonic Crystals: Molding the Flow of Light," Princeton University Press (1995).
Johnson, "Optical Scanners," Microwave Scanning Antennas, vol. 1, p. 251-261, (1964).
Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).
Lee et al., "The Surface/Bulk Micromachining (SBM) Process: A New Method for Fabricating Released MEMS in Single Crystal Silicon", Journal of Microelectromechanical Systems, vol. 8, Issue 4, pp. 409-416, (Dec. 1999).
Light over Matter, Circle No. 36 (Jun. 1993).
Lin et al., "Free-Space Micromachined Optical Switches for Optical Networking," IEEE Journal of Selected Topics in Quantum Electronics, vol. 5, No. 1, pp. 4-9. (Jan./Feb. 1999).
Little et al., "Vertically Coupled Microring Resonator Channel Dropping Filter," IEEE Photonics Technology Letters, vol. 11, No. 2, (1999).
Magel, "Integrated Optic Devices Using Micromachined Metal Membranes," SPIE vol. 2686, 0-8194-2060-Mar. 1996.
Miles, Mark, W., "A New Reflective FPD Technology Using Interferometric Modulation," The Proceedings of the Society for Information Display (May 11-16, 1997).
Nagami et al., "Plastic Cell Architecture: Towards Reconfigurable Computing For General-Purpose," IEEE, 0-8186-8900-, pp. 68-77, (May 1998).
Newsbreaks, "Quantum-trench devices might operate at terahertz frequencies," Laser Focus World (May 1993).
Oliner et al., "Radiating Elements and Mutual Coupling," Microwave Scanning Antennas, vol. 2, pp. 131-141, (1966).
PCT/US02/13442, Search Report Sep. 13, 2002.
PCT/US04/20330 Search Report Nov. 8, 2004.
PCT/US05/029821 International Search Report (Dec. 27, 2005).
PCT/US05/030927 International Search Report (0125/2006).
PCT/US05/031693 International Search Report.
PCT/US05/032331 International Search Report (Apr. 7, 2006).
PCT/US05/033558 Partial International Search Report (Feb. 24, 2006).
PCT/US2004/035820 International Search Report and Written Opinion (Nov. 4, 2005).
PCT/US96/17731 Search Report.
Raley et al., "A Fabry-Perot Microinterferometer for Visible Wavelengths," IEEE Solid-State Sensor and Actuator Workshop, Jun. 1992, Hilton Head, SC.
Schnakenberg et al., "TMAHW Etchants for Silicon Micromachining," 1991 International Conference on Solid State Sensors and Actuators-Digest of Technical Papers, pp. 815-818 (1991).
Sperger et al., "High Performance Patterned All-Dielectric Interference Colour Filter for Display Applications," SID Digest, pp. 81-83, (1994).
Sridharan et al., "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.
Stone, "Radiation and Optics, An Introduction to the Classical Theory," McGraw-Hill, pp. 340-343, (1963).
Walker et al., "Electron-beam-tunable Interference Filter Spatial Light Modulator," Optics Letters vol. 13, No. 5, pp. 345-347, (May 1988).
Williams et al., "Etch Rates for Micromachining Processing," Journal of Microelectromechanical Systems, vol. 5, No. 4, pp. 256-259 (Dec. 1996).
Winters et al., "The etching of silicon with XeF2 vapor. Applied Physics Letters," vol. 34, No. 1, pp. 70-73 (Jan. 1979).
Winton, "A novel way to capture solar energy," Chemical Week, (May 1985).
Wu, "Design of a Reflective Color LCD Using Optical Interference Reflectors," ASIA Display '95, pp. 929-931, (Oct. 1995).
Zhou et al., "Waveguide Panel Display Using Electromechanical Spatial Modulators" SID Digest, vol. XXIX, (1998).
Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Austrian Search Report for EX72/2005 dated May 13, 2005.
Austrian Search Report for EX81/2005 dated May 18, 2005.
Austrian Search Report for EX170/2005 dated Jul. 6, 2005.
Austrian Search Report for EX139/2005 dated Jul. 27, 2005.
Austrian Search Report for EX144/2005 dated Aug. 11, 2005.
Bains, "Digital Paper Display Technology Holds Promise For Portables," CommsDesign EE Times (2000).
Bass, Handbook of Optics, vol. 1, Fundamentals, Techniques, and Design, Second Edition, McGraw-Hill, inc. New York pp. 2.29/2.36 (1995).
Chu, et al. "Formation and Microstructures of Anodic Aluminoa Films from Aluminum Sputtered onglass Substrate" Journal of the Electrochemical Society, 149 (7) B321-B327 (2002).
Crouse, "Self-ordered pore structure of anodized aluminum on silicon and pattern transfer" Applied Physics Letters, vol. 76, No. 1, Jan. 3, 2000. pp. 49-51.
French, P.J. "Development of Surface Micromachining techniques compatable with on-chip electronics" Journal of Micromechanics and Microengineering vol. 6 No. 2, 197-211 XP 002360789 (Jun. 1996) IOP Publishing.
Furneaux, et al. "The Formation of Controlled-porosity membranes from Anodically Oxidized Aluminium" Nature vo 337 Jan. 12, 1989, pp. 147-149.
Jerman J. H. et al., "Maniature Fabry-Perot Interferometers Micromachined in Silicon for Use in Optical Fiber WDM Systems," Transducers. San Francisco, Jun. 24-27, 1991, Proceedings of the Internatioal Conference on Solid State Sensors Andactuators, New Youk IEEE, US, vol. Conf. 6, Jun. 24, 1991.
Lieberman, "MEMS Display Looks to Give PDAs Sharper Image," EE Times (Feb. 11, 1997).
Lieberman, "Microbridges at Heart of New MEMS Displays," EE Times (Apr. 24, 1997).
Maboudian, et al. Critical Review: Adhesion in Surface Micromechanical Structures: J. Vac. Sci Techno. B 15(1) Jan./Feb. 1997, pp. 1-20.
MICROCHEM, LOR Lift-Off Resists Datasheet, 2002.
Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).
Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).
Penta Vacuum MEMS Etcher Specifications, http://www.pentavacuum.com/memes.htm.
Science and Technology, The Economist, pp. 89-90, (May 1999).
Search Report PCT/US05/030033 and Written Opinion.
Search Report PCT/US05/030902.
Search Report and Written Opinion for PCT/US05/33558 (May 19, 2005).
Search Report PCT/US05/032331 (Apr. 7, 2006).
Search Report PCT/US05/032331 (Jan. 9, 2006).
Search Report and written opinion PCT/US05/032647.
Tayebi et al. "Reducing the Effects of adhesion and friction in microelectromechanical systesm (MEMS) through surface roughening: Comparision Between theory and experiments" http://jap.ajp.org/jap/copyright.isp Journal of applied Physics 98, 073528 (2005).
Thin Film Transistors- Materials and Processes—vol. 1 Amorphous Silicon Thin Film Transistors ed. Yue Kuo, Kluwer Academic Publishers, Boston (2004).
Xactix Xetch X Specifications, http://xactix.com/Xtech X3specs.htm. Jan. 5, 2005.
Xactix Xetch Product information.

* cited by examiner

|  | Column Output Signals | |
|---|---|---|
|  | $+V_{bias}$ | $-V_{bias}$ |
| Row Output Signals   0 | Stable | Stable |
| $+\Delta V$ | Relax | Actuate |
| $-\Delta V$ | Actuate | Relax |

US 7,405,863 B2

PATTERNING OF MECHANICAL LAYER IN MEMS TO REDUCE STRESSES AT SUPPORTS

BACKGROUND OF THE INVENTION

Microelectromechanical systems (MEMS) include micro mechanical elements, actuators, and electronics. Micromechanical elements may be created using deposition, etching, and/or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY OF THE INVENTION

In one embodiment, a method of fabricating a microelectromechanical systems (MEMS) device is provided, the method including forming an electrode layer over a substrate, depositing a sacrificial layer over the electrode layer, forming at least one support structure, the support structure extending through the sacrificial layers, where the support structure includes a substantially horizontal wing portion extending around the periphery of the support structure, depositing a mechanical layer over the support structure, and patterning the mechanical layer to form an aperture overlying a portion of the support structure.

In another embodiment, a MEMS device is provided, including an electrode layer located over a substrate, at least one support structure, and a mechanical layer located over the support structure and spaced apart from the electrode layer by a cavity, the mechanical layer including an aperture overlying at least a portion of the support structure, where an annular section of the mechanical layer that is defined by the aperture extends about the periphery of the support structure and overlies the support structure.

In another embodiment, a MEMS device is provided, including first means for electrically conducting, second means for electrically conducting, and means for supporting said second conducting means, wherein the second electrically conducting means overlies only an exterior portion of the supporting means, and wherein the second conducting means is movable relative to the first conducting means in response to generating electrostatic potential between the first and second conducting means.

DETAILED DESCRIPTION OF THE PREFERRED EMBODIMENT

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

In embodiments in which a MEMS device includes a mechanical layer deposited over a support structure, such as a support post, mismatches in stresses within the mechanical layer and the support post can result in undesirable flexure of the support post. In an embodiment in which the MEMS device comprises an interferometric modulator, a change in the unactuated position of the mechanical layer will have an undesirable effect on the performance of the MEMS device, such as a shift in the color reflected by the interferometric modulator. In one embodiment, in which the support structure has a non-flat upper surface, portions of the mechanical layer not overlying the flat upper surface of the support post are removed. This advantageously reduces the number of transitions in the shape of the mechanical layer, which transitions would exacerbate the undesired flexure of the edges of the support posts.

Figure 1:
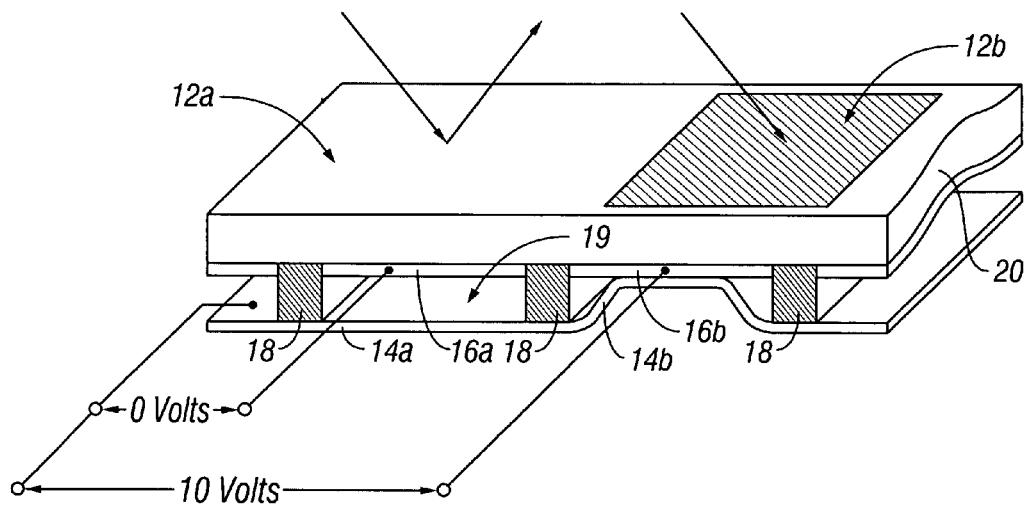
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent, and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
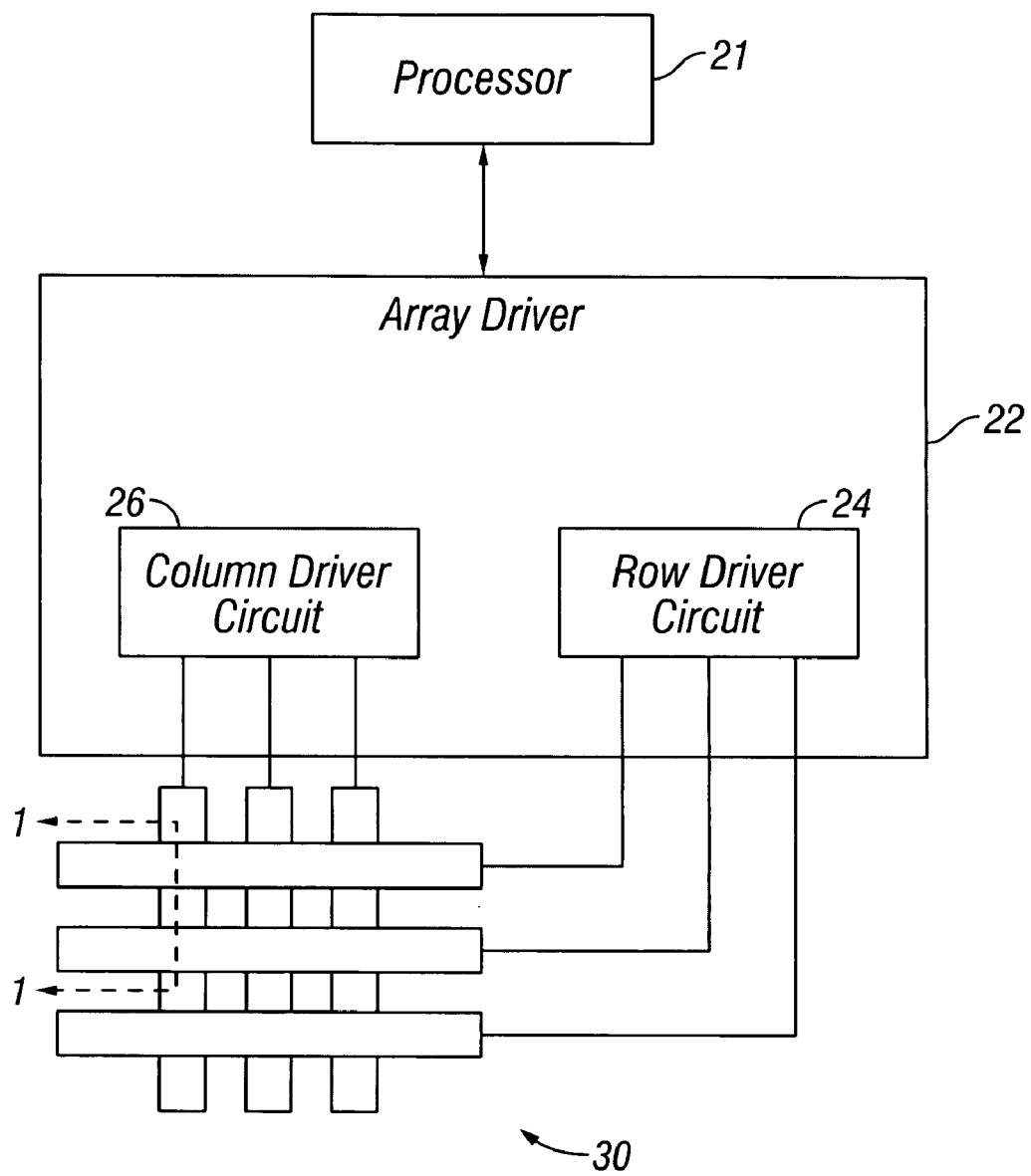
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. Thus, there exists a window of applied voltage, about 3 to 7 V in the example illustrated in FIG. 3, within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
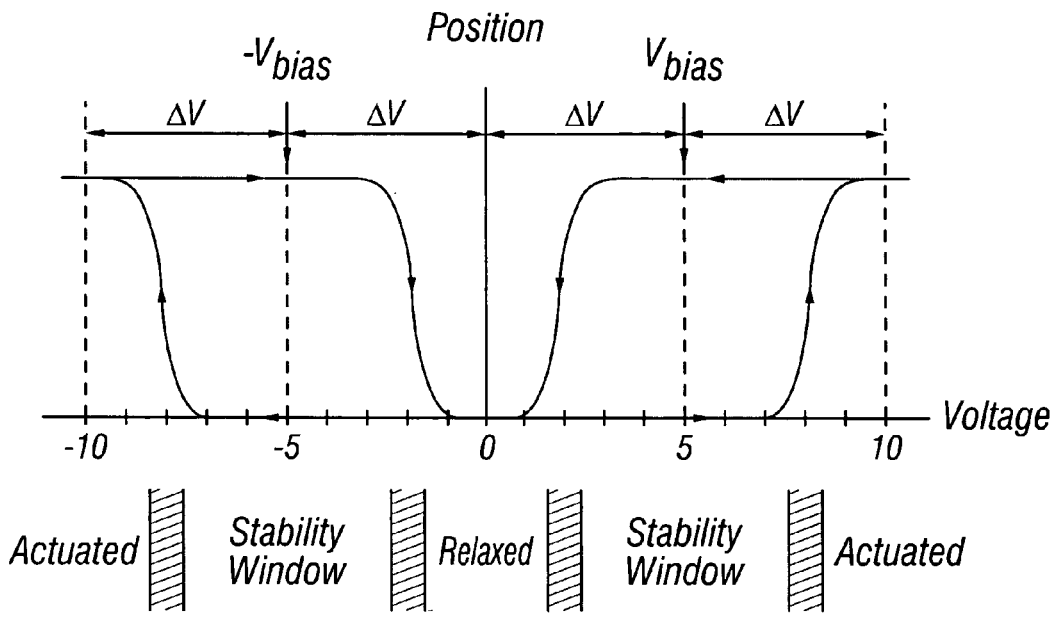
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
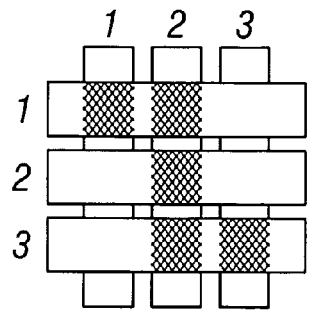
FIG. 5A illustrates one exemplary frame of display data in the 3×3 interferometric modulator display of FIG. 2.
Figure 5B:
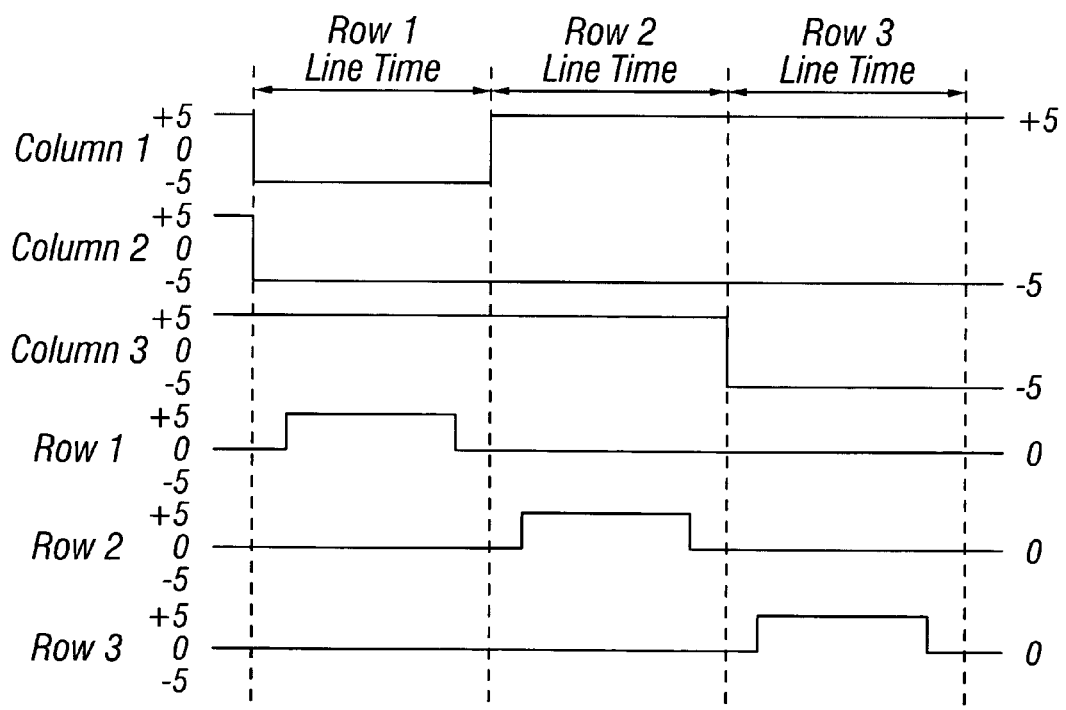
FIG. 5B illustrates one exemplary timing diagram for row and column signals that may be used to write the frame of FIG. 5A.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts, respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
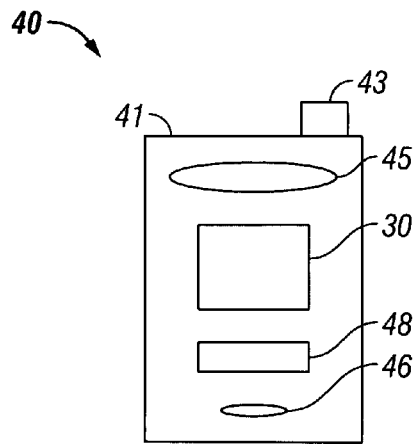
FIGS. 6A and 6B are system block diagrams illustrating an embodiment of a visual display device comprising a plurality of interferometric modulators.
Figure 6B:
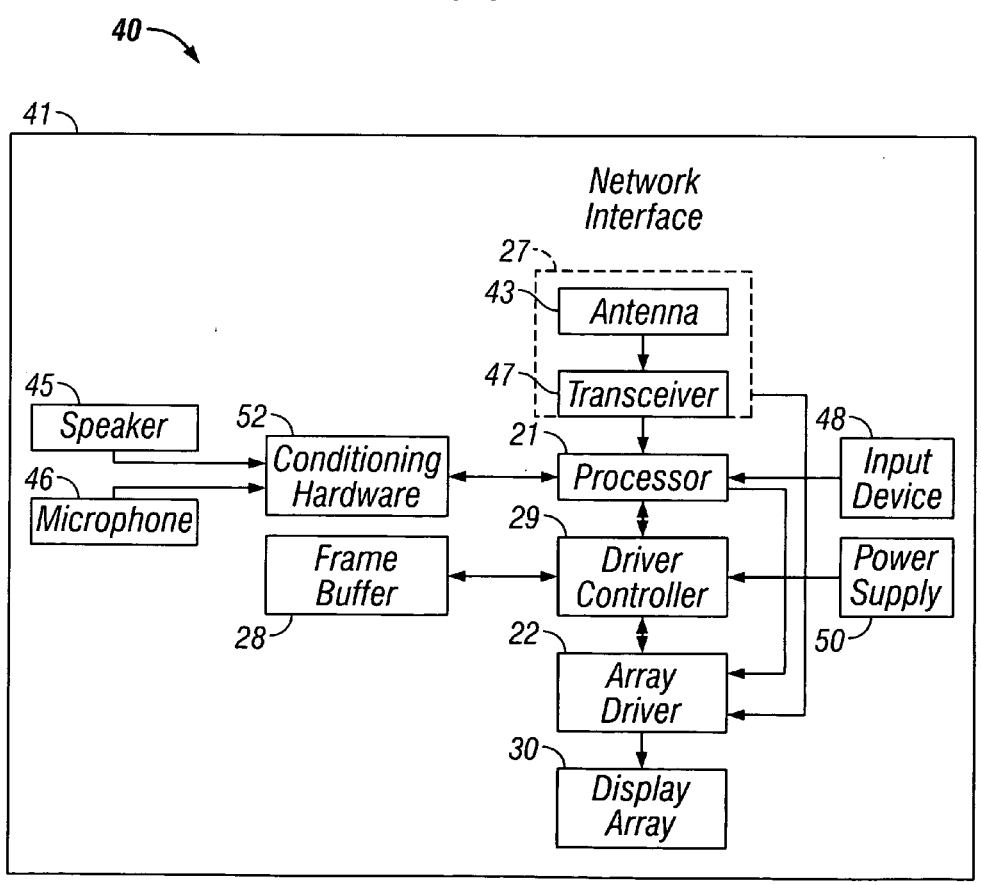

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding and vacuum forming. In addition, the housing 41 may be made from any of a variety of materials, including, but not limited to, plastic, metal, glass, rubber, and ceramic, or a combination thereof. In one embodiment, the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of the exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28 and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one or more devices over a network. In one embodiment, the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be memory device such as a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, the array driver 22, and the display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, the display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, or a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell including a plastic solar cell, and solar-cell paint. In another embodiment, the power supply 50 is configured to receive power from a wall outlet.

In some embodiments, control programmability resides, as described above, in a driver controller which can be located in several places in the electronic display system. In some embodiments, control programmability resides in the array driver 22. Those of skill in the art will recognize that the above-described optimizations may be implemented in any number of hardware and/or software components and in various configurations.

Figure 7A:
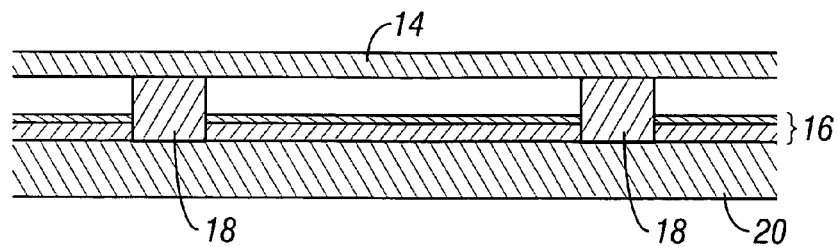
FIG. 7A is a cross section of the device of FIG. 1.
Figure 7B:
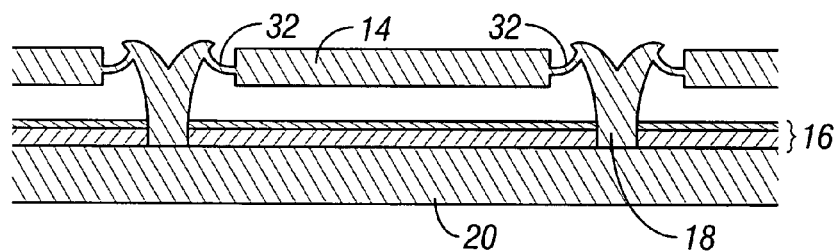
FIG. 7B is a cross section of an alternative embodiment of an interferometric modulator.
Figure 7C:
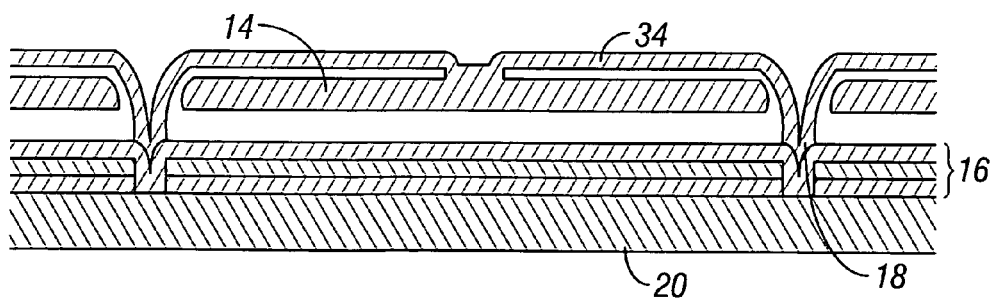
FIG. 7C is a cross section of another alternative embodiment of an interferometric modulator.
Figure 7D:
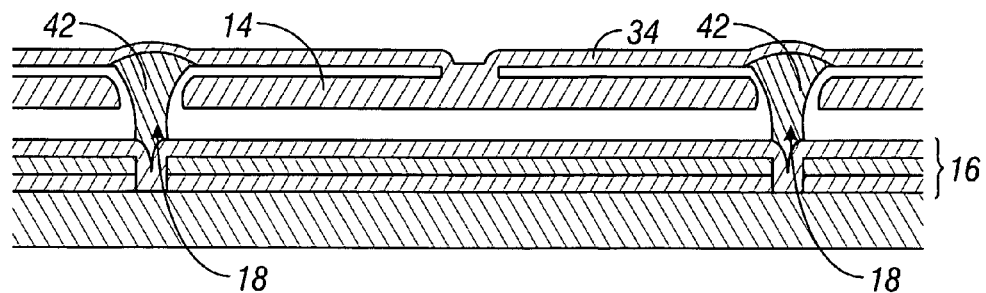
FIG. 7D is a cross section of yet another alternative embodiment of an interferometric modulator.
Figure 7E:
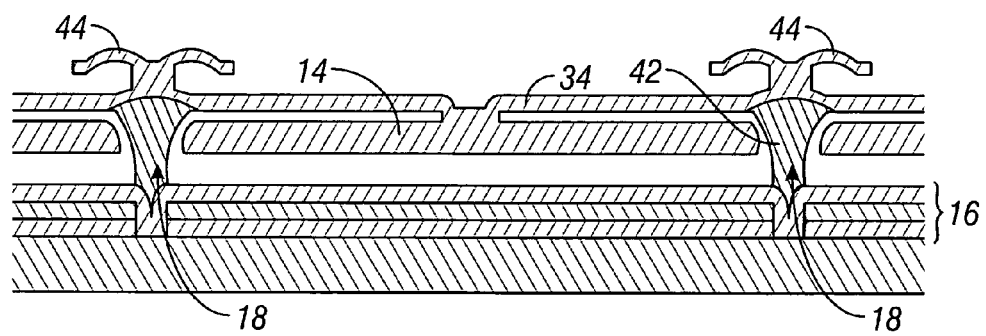
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts or structures 18. The embodiment illustrated in FIG. 7D has support post structures 18 that include support plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts 18 are formed of a planarization material, which is used to form the support post plugs 42. The embodiment illustrated in FIG. 7E is based on the embodiment shown in FIG. 7D, but may also be adapted to work with any of the embodiments illustrated in FIGS. 7A-7C, as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
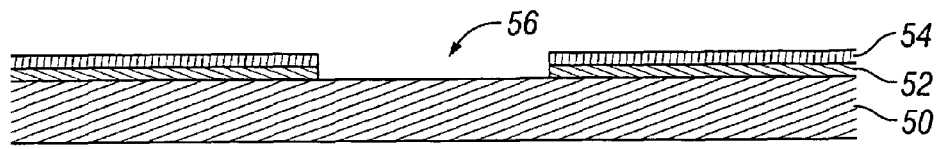
FIGS. 8A-8H are schematic cross-sections depicting certain steps in the fabrication of an array of MEMS devices.

In one embodiment, a method of manufacturing an array of MEMS devices, such as the interferometric modulators described above, is described with respect to FIGS. 8A-8H. In FIG. 8A, it can be seen that an electrode layer 52 has been deposited on a substrate 50, and that a partially transparent or partially reflective layer 54 has been deposited over the electrode layer 52. The partially reflective layer 54 and the electrode layer 52 are then patterned and etched to form gaps 56 which may define strip electrodes formed from the electrode layer 52. In addition, the gap 56 may define the location where a support structure will be formed. In one embodiment, the electrode layer 52 comprises indium-tin-oxide (ITO). In one embodiment, the partially reflective layer 54 comprises a layer of chromium (Cr). In other embodiments, the placement of the layers 52 and 54 may be reversed, such that the partially reflective layer is located underneath the electrode layer 54. In another embodiment, a single layer (not shown) may serve as both the electrode layer and the partially reflective layer. In other embodiments, only one of the electrode layer 52 or the partially reflective layer 54 may be formed.

Figure 8B:
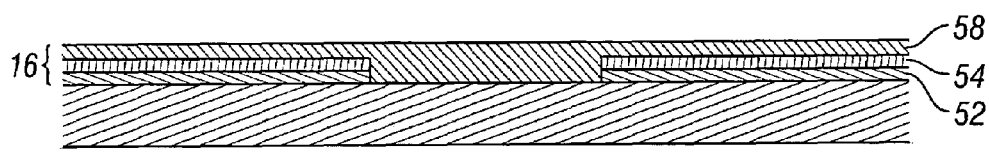

In FIG. 8B, it can be seen that a dielectric layer 58 has been deposited over the patterned electrode layer 52 and partially reflective layer 54. In one embodiment, the dielectric layer 58 may comprise $SiO_2$. In further embodiments, one or more etch stop layers (not shown) may be deposited over the dielectric layer. These etch stop layers may protect the dielectric layer during the patterning of overlying layers. In one embodiment, a etch stop layer comprising $Al_2O_3$ may be deposited over the dielectric layer 58. In a further embodiment, an additional layer of $SiO_2$ may be deposited over the etch stop layer.

Figure 8C:
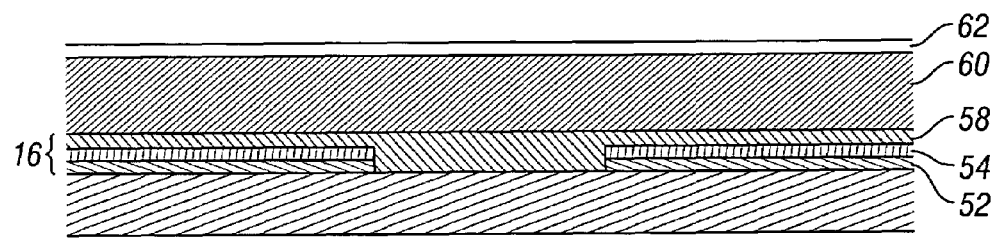

In FIG. 8C, a sacrificial layer 60 has been deposited over the dielectric layer 58. In one embodiment, the sacrificial layer 60 comprises molybdenum (Mo) or silicon (Si), but other materials, such as tungsten (W), may be appropriate. Advantageously, the sacrificial layer 60 is selectively etchable with respect to the layers surrounding the sacrificial layer 60. As can also be seen in FIG. 8C, a movable layer, in the illustrated embodiment taking the form of a reflective layer 62, has been deposited over the sacrificial layer. In certain embodiments, this movable layer will comprise a conductive material. In the illustrated embodiment, unlike the partially reflective layer 54, the reflective layer 62 need not transmit any light through the layer, and thus advantageously comprises a material with high reflectivity. In one embodiment, the reflective layer 62 comprises aluminum (Al) or aluminum alloys, as aluminum has both very high reflectivity and acceptable mechanical properties. In other embodiments, specular materials such as silver and gold may be used in the reflective layer 62. In further embodiments, particularly in non-optical MEMS devices in which the movable layer need not be reflective, other materials, such as nickel and copper may be used in the movable layer.

Figure 8D:
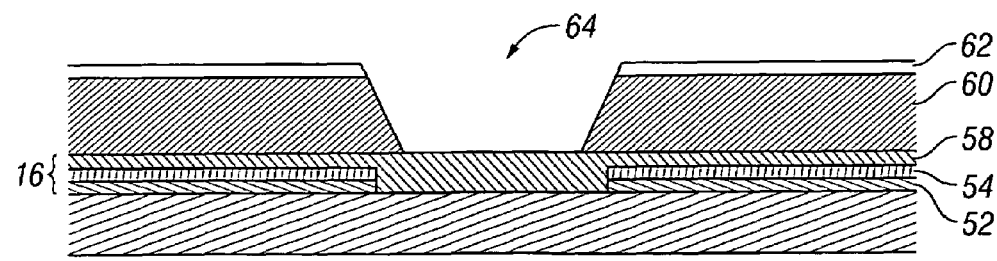

In FIG. 8D, the sacrificial layer 60 and the reflective layer 62 have been patterned and etched to form apertures 64 which extend through the sacrificial and reflective layers 60 and 62. As can be seen in the illustrated embodiment, these apertures 64 are preferably tapered to facilitate continuous and conformal deposition of overlying layers.

Figure 8E:
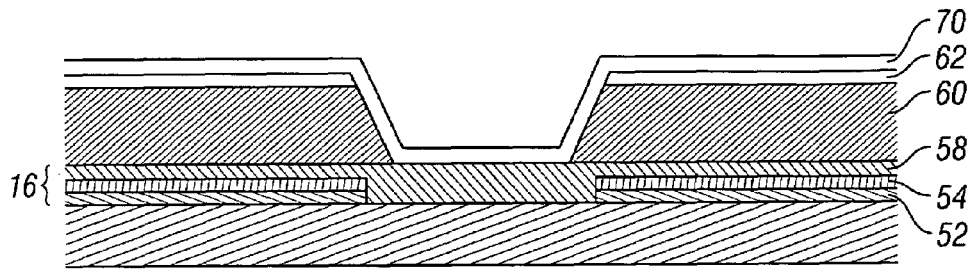

With respect to FIG. 8E, it can be seen that a post layer 70 has been deposited over the patterned reflective layer 62 and sacrificial layer 60. This post layer 70 will form support posts located throughout an array of MEMS devices. In embodiments in which the MEMS devices being fabricated comprise interferometric modulator elements (such as modulator elements 12a and 12b of FIG. 1), some of the support posts (such as the support structures 18 of FIG. 1) will be located at the edges of the upper movable electrodes (such as the movable reflective layer 14 of FIG. 1) of those interferometric modulator elements. In addition, support posts may also be formed in the interior of the resulting interferometric modulator elements, away from the edges of the upper movable electrode, such that they support a central or interior section of the upper movable electrode. In one embodiment, the post layer 70 comprises $SiO_2$, but a wide variety of post materials, such as $SiN_x$, may also be used. In certain embodiments, the post layer 70 may comprise an inorganic material. Preferably, the post layer 70 is conformally and continuously deposited, particularly over the apertures 64 (FIG. 8D).

Figure 8F:
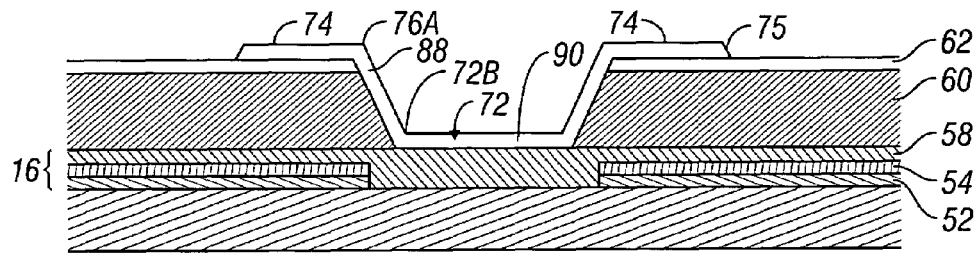

In FIG. 8F, it can be seen that the post layer 70 has been patterned and etched to form a post structure 72. In addition, it can be seen that the illustrated post structure 72 has a peripheral portion which extends horizontally over the underlying layers; this horizontally-extending peripheral portion will be referred to herein as a wing portion 74. As with the patterning and etching of the sacrificial layer 60, the edges 75 of the post structure 72 are preferably tapered or beveled in order to facilitate deposition of overlying layers with better step coverage and reduced stress. In the illustrated embodiment, the post structure 72 further comprises a sloped sidewall portion 88 and a substantially flat base portion 90. It can be seen that a transition 76a exists between the substantially horizontal wing portion 74 and the sloped sidewall portion 88, and that a transition 76b exists between the sloped sidewall portion 88 and the substantially flat base portion 90.

Because the reflective layer 62 was deposited prior to the deposition of the post layer 70, it will be seen that the reflective layer 62 may serve as an etch stop during the etching process used to form the post structure 72, as the portion of the post structure 72 being etched is isolated from the underlying sacrificial layer 60 by the reflective layer 62, even though other portions of the post layer 70 are in contact with the sacrificial layer 60. Thus, an etch process can be used to form the post structures 72 which would otherwise also etch the sacrificial layer 60.

Variations to the above process may be made, as well. In one embodiment, the reflective layer may be deposited after the patterning and etching of the sacrificial layer, such that the post layer may be completely isolated from the sacrificial layer, even along the sloped sidewalls of the apertures in the sacrificial layer. Such an embodiment provides an etch stop protecting the post structure during the release etch to remove the sacrificial layer. In another embodiment, the post layer may be deposited over a patterned sacrificial layer prior to the deposition of the reflective layer, as will be understood from the description of FIGS. 11A-11F below. Such an embodiment may be used if the sacrificial layer will not be excessively consumed during the etching of the post structure, even without an etch stop.

Figure 8G:
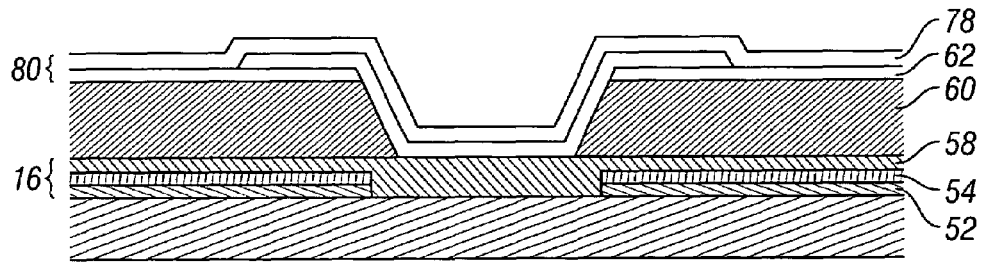

In FIG. 8G, it can be seen that a mechanical layer 78 has been deposited over the post structures 72 and the exposed portions of the reflective layer 62. As the reflective layer 62 provides the reflective portion of the interferometric modulator element, the mechanical layer 78 may advantageously be selected for its mechanical properties, such as the modulus of elasticity, without regard for the reflectivity. In one embodiment, the mechanical layer 78 advantageously comprises nickel (Ni), although various other materials, such as Al, may be suitable. For convenience, the combination of the mechanical layer 78 and reflective layer 62 may be referred to collectively as the deformable electrode or deformable reflective layer 80.

After deposition of the mechanical layer 78, the mechanical layer 78 is patterned and etched to form desired structures. In particular, the mechanical layer 78 may be patterned and etched to form gaps which define electrodes formed from strips of the mechanical layer which are electrically isolated from one another. The underlying reflective layer 62 may also be patterned and etched to remove the exposed portions of the reflective layer 62. In one embodiment, this may be done via a single patterning and etching process. In other embodiments, two different etches may be performed in succession, although the same mask used to pattern and etch the mechanical layer 78 may be left in place and used to selectively etch the reflective layer 62. In one particular embodiment, in which the mechanical layer 68 comprises Ni and the reflective layer 62 comprises Al, the Ni may be etched by a nickel etch (which generally comprise nitric acid, along with other components), and the Al may be etched by either a phosphoric/acetic acid etch or a PAN (phosphoric/acetic/nitric acid) etch. A PAN etch may be used to etch Al in this embodiment, even though it may etch the underlying sacrificial layer 62 as well, since the deformable reflective layer 80 has already been formed over the sacrificial layer 62, and the desired interelectrode spacing has thus been obtained. Any extra etching of the sacrificial layer 62 during this etch will not have a detrimental effect on the finished interferometric modulator.

Figure 8H:
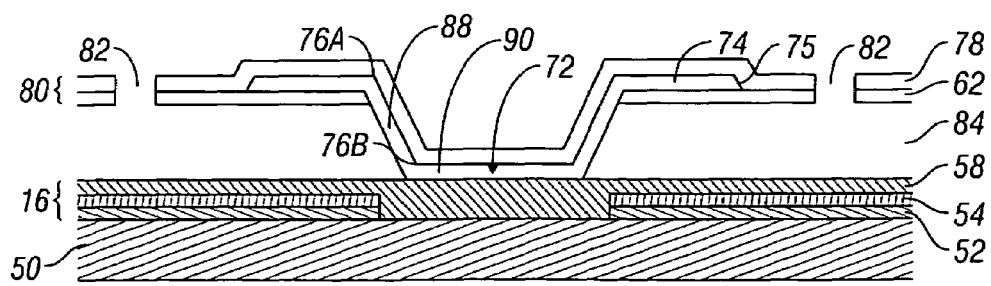

In FIG. 8H, it can be seen that the deformable electrode or reflective layer 80, which comprises the mechanical layer 78 and the reflective layer 62, has also been patterned and etched to form etch holes 82. A release etch is then performed to selectively remove the sacrificial layer 60 (FIG. 8G), forming a cavity 84 which permits the deformable reflective layer 80 to deform toward the electrode layer 52 upon application of appropriate voltage. In one embodiment, the release etch comprises a fluorine-based etch, such as a $XeF_2$ etch, which will selectively remove sacrificial materials like Mo, W, or silicon without significantly attacking surrounding materials such as Al, $SiO_2$, Ni, or $Al_2O_3$. The etch holes 82, along with gaps 81 between the strip electrodes 83 (see FIG. 8I) formed from the mechanical layer 78, advantageously permit exposure of the sacrificial layer 60 to the release etch.

Figure 8I:
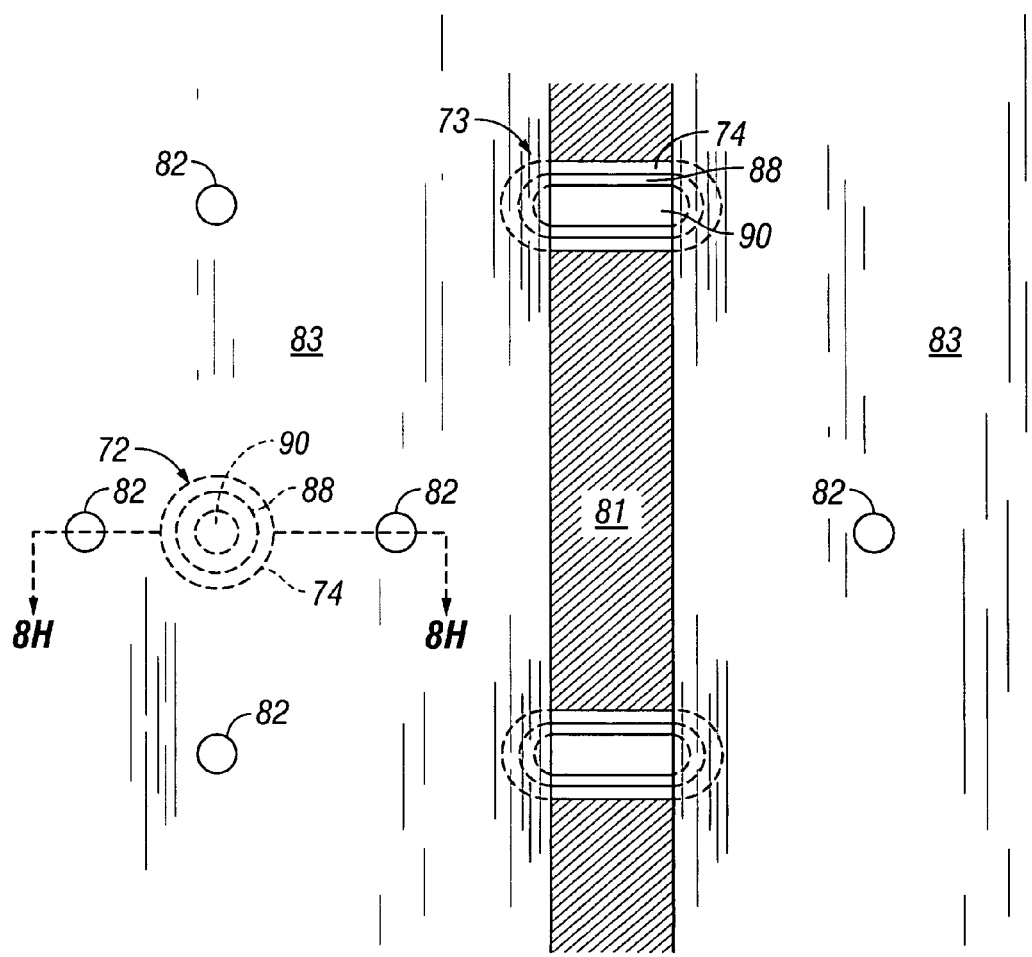
FIG. 8I is a top plan view of the array of MEMS devices fabricated by the process of FIGS. 8A-8H.

FIG. 8I depicts an overhead view of an array of MEMS devices, which include support structures 72 such as the support structure 72 of FIG. 8H. As can be seen, two upper strip electrodes 83, which are separated by a gap 81, completely overlay certain support structures 72 located underneath the upper electrodes 83. In the illustrated embodiment, certain other support structures 73 extend across the gap 81, supporting two upper electrodes 83. As can be seen in FIG. 8I, the shape of these edge support structures 73, may differ from the shape of the interior support structures 72 which are located underneath the upper electrode 83. As can also be seen, etch holes 82 extend through the upper electrodes 83. In other embodiments (not shown), support structures may not extend across the gap 81, but may rather be positioned near the edges of the electrodes 83, such that a support structure provides support for a single electrode 83 near the edge of the electrode next to the gap 81.

As can be seen in FIG. 8H, the height of the sacrificial layer 60 determines the height of the cavity 84 resulting from the removal of the sacrificial layer 60. As discussed above, in an embodiment in which MEMS devices being fabricated comprise interferometric modulators, the height of the cavity determines the color reflected by the interferometric modulator in the unactuated, or relaxed, state illustrated in FIG. 8H. Thus, it is important that the deformable electrode or reflective layer 80 remains at a predetermined position (e.g., at a particular distance from the partially reflective layer 54) when the interferometric modulator element is in a relaxed state. Preferably, during deposition of the mechanical layer 78 as described with respect to FIG. 8G, the mechanical layer 78 is formed such that it contains residual tensile stress. This residual tensile stress will tend to pull the mechanical layer 78, and therefore the deformable electrode or reflective layer 80, into the illustrated substantially flat position between support posts.

However, in multilayer structures, these residual stresses can also be problematic. In particular, undesired flexure of the support structures and the mechanical layer overlying the support structures may occur as a result of unbalanced stresses within support structures such as post structures 72 and the mechanical layer 78. In some situations, these unbalanced stresses are the result of inherent stresses within the materials forming the support structures 72 and the mechanical layer 78. An additional source of unbalanced stresses is the thermal expansion of the layers in response to changes in temperature, which is a function of the mismatch between the coefficients of thermal expansion of two different materials, the operating temperatures of the MEMS device, the moduli of elasticity of the materials, and the material deposition conditions during fabrication of the MEMS device. When adjoining layers have different coefficients of thermal expansion, deflection may not only be caused by the relative change in size of adjoining layers, but the total deflection may vary as a result of the operating temperature. Because such deflection will alter the height of the interferometric cavity, and therefore the color reflected by the interferometric modulator element, it is desirable to eliminate or minimize such deflection to the amount possible.

This deflection is exacerbated by the shapes of the support structure 72 and the overlying mechanical layer 78. In the illustrated embodiment, as can be seen in FIGS. 8H and 8I, the support structure 72 comprises the horizontal wing portion 74, as well as a sloped sidewall portion 88 and a substantially flat base portion 90. The mechanical layer 78 which overlies these portions of the support structure 72 will be contoured to the same shape, so long as the mechanical layer 78 comprises a non-planarizing material (e.g., CVD or PVD formed). There are thus two transitions in the mechanical layer 78 as it moves from the substantially flat base portion 90 of the support structure 72, up the sloped sidewall portion 88, and over the wing portion 74. These transitions, at which both the mechanical layer 78 and support post 72 bend, will result in additional undesired flexure of portions of the interferometric modulator due to stress mismatches and changes in size of the mechanical layer 78. These transitions correspond to the transitions 76a and 76b in the support structure 72 discussed with respect to FIG. 8F, and occur because the mechanical layer 78 in the embodiment of FIG. 8H extends over both transitions 76a, 76b in the support structure 72.

In one embodiment, the risk of deflection of the support structures due to mismatches between the support structures and the mechanical layer overlying those support structures may be minimized through the selective removal of certain portions of the mechanical layer. In one embodiment, discussed with respect to FIGS. 9A-9C, a method for fabricating such a MEMS device includes the steps discussed with respect to FIGS. 8A-8G.

Figure 9A:
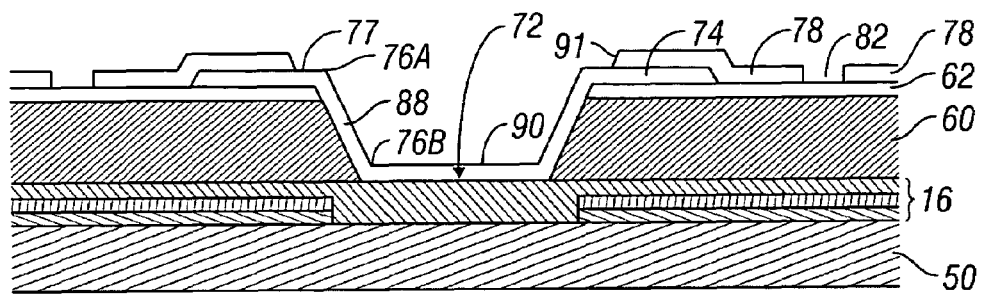
FIGS. 9A-9C are schematic cross-sections depicting certain alternate steps in the fabrication of an array of MEMS devices.

In FIG. 9A, it can be seen that the mechanical layer 78 has been patterned and etched to remove portions of the mechanical layer 78 located over the support structure 72, and has also simultaneously been etched to form etch holes 82 extending through the mechanical layer 78. As discussed above, the mechanical layer 78 may be further etched at this point to form other structures, including the etching of gaps 81 in the mechanical layer 78 which will define upper strip electrodes 83 (see FIG. 9D). In the illustrated embodiment, the portions of the mechanical layer 78 overlying both the sloped sidewall portion 88 and the substantially flat base portion 90 have been removed to form an aperture 91 through the mechanical layer, so that the mechanical layer 78 is in contact with and supported by only the wing portions 74 of the support structure 72. A portion 77 of the flat upper wing portion 74 is exposed by this aperture 91. Such an embodiment advantageously avoids the overlaying of the mechanical layer 78 over both the transition 76a between the substantially horizontal wing portion 74 and the sloped sidewall portion 88 and the transition 76b between the sloped sidewall portion 88 and the substantially flat base portion 90, minimizing the deflection that may occur due to the mismatch.

Figure 9B:
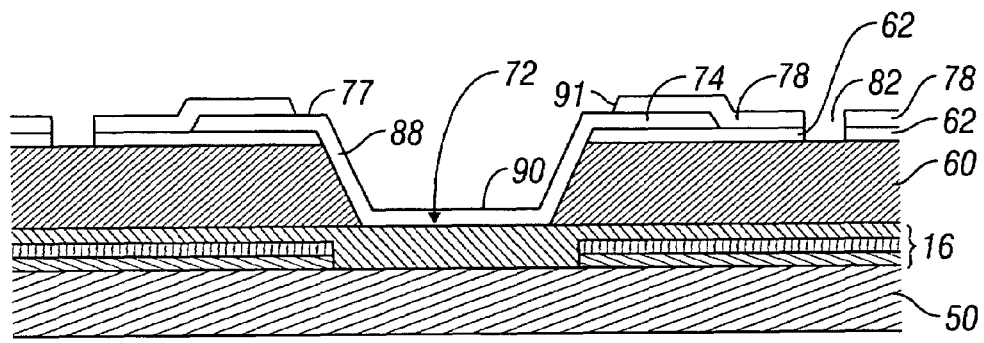

Now, in FIG. 9B, it can be seen that the portions of the reflective layer 62 exposed by the etch holes 82 extending through the mechanical layer 78 (see FIG. 9A) are removed, such that the etch holes 82 now extend through both the mechanical layer 78 and the reflective layer 62, exposing portions of the underlying sacrificial layer 60. It will be understood that in certain embodiments, depending on the composition and thickness of the deposited and underlying layers, the mechanical layer 78 and the reflective layer 62 may be patterned and etched in a single process.

Figure 9C:
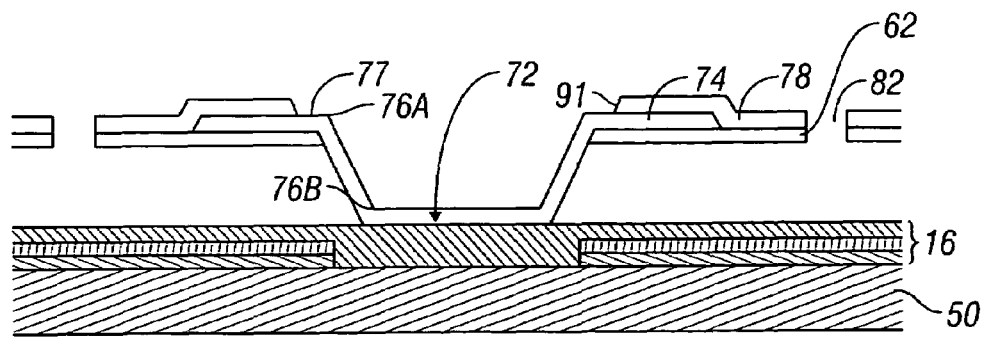

In FIG. 9C, the sacrificial layer 60 (see FIG. 9B) has been removed, such as by a release etch process. As discussed above, this release etch may comprise a fluoride-based etch, such as a xenon difluoride etch. A released MEMS device is thus formed, having a support post 72 supporting a mechanical layer 78, wherein the mechanical layer 78 extends over only a portion of the support post 72. In the illustrated embodiment, the mechanical layer 78 extends only over the substantially horizontal wing portion of the support post 72. It will be understood that while the illustrated support post 72 is an interior support post, and is surrounded by the mechanical layer 72 on all sides, other support posts, referred to as edge posts, may extend into the gaps between upper strip electrodes.

Figure 9D:
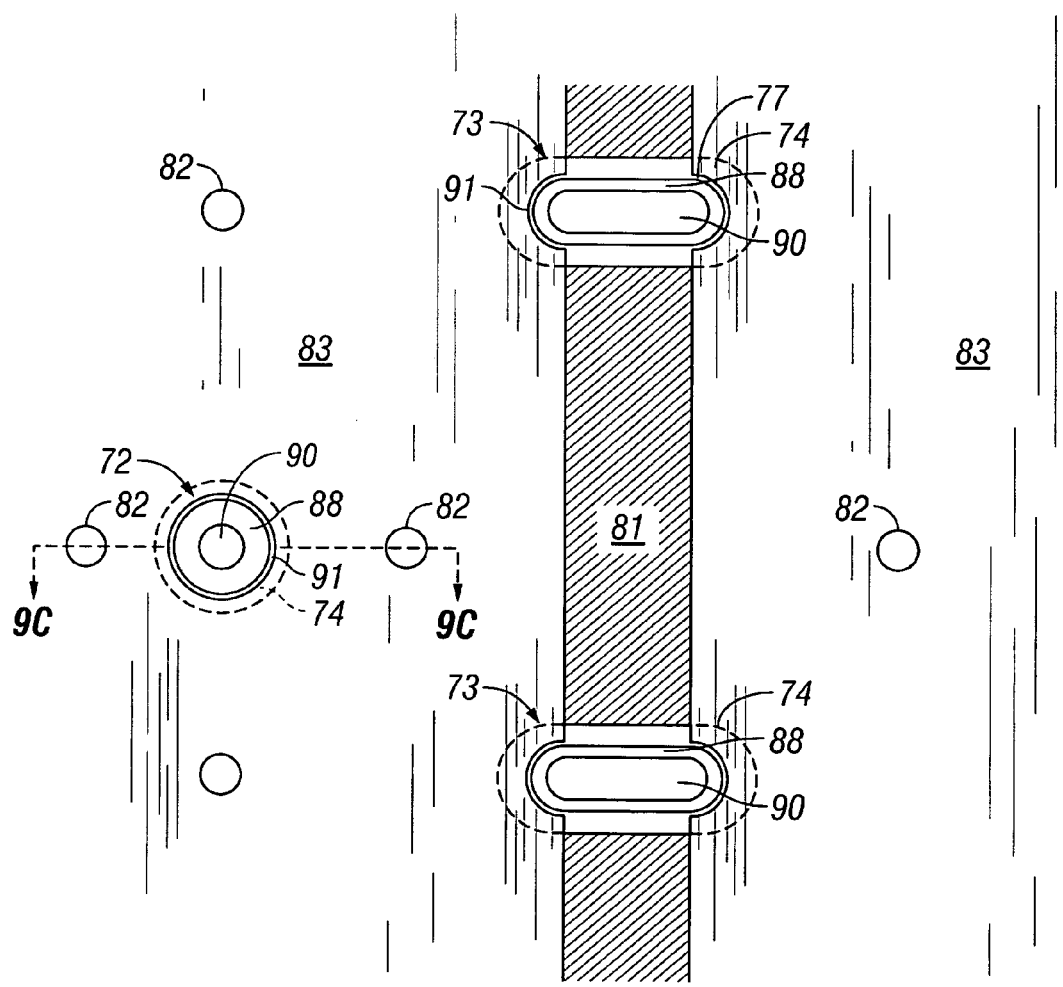
FIG. 9D is a top plan view of a portion of the array of MEMS devices fabricated by the method of FIGS. 9A-9C.

FIG. 9D depicts an overhead view of an array of MEMS devices, which include support structures 72 such as the support structure 72 of FIG. 9C. It can be seen that the array of FIG. 9D differs from that of FIG. 8I in that the upper electrode 83, which comprises the mechanical layer 78 (see FIG. 9C), overlies only the substantially horizontal wing portions 74 of the interior support structure 72 and the edge support structure 73. The sloped sidewall portion 88 and the base 90 of the support structure are exposed due to the formation of aperture 91 in the mechanical layer 78 and reflective layer 62 (see FIG. 9B). In the illustrated embodiment, a narrow annular inner portion 77 of the wing portions 74 is exposed by the aperture 91, such that the transition or corner 76a (see FIG. 9C) between the wing portions 74 and the sidewall portion 88 is exposed.

In the embodiment of FIGS. 9C and 9D, the mechanical layer 78 extends over only parts of the wing portion 74 of the support structure 72. However, in other embodiments, the mechanical layer 78 may still extend over other portions of the support structure 72. One particular embodiment is described with respect to FIGS. 10A and 10B.

Figure 10A:
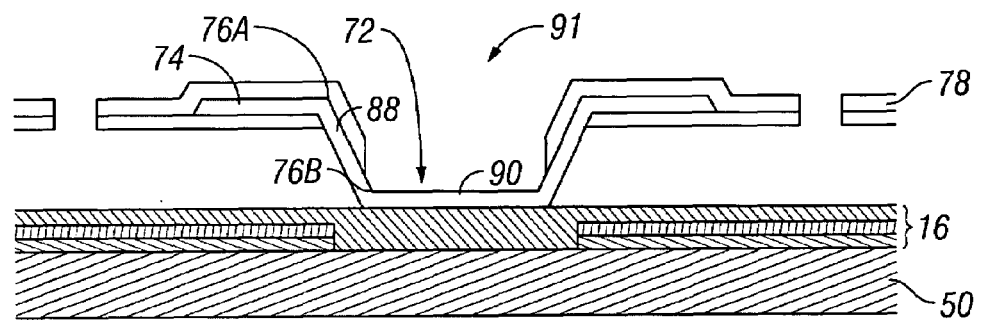
FIG. 10A is a schematic cross-section of an alternate embodiment of a MEMS device.

FIG. 10A shows a cross-section of a fabricated MEMS device, in which it can be seen that the mechanical layer 78 has been patterned to form an aperture 91 overlying a portion of the support structure 72, such that the mechanical layer extends down a portion of the sloped sidewall portion 88, such that the mechanical layer 78 overlays only the upper transition 76a in the shape of the support structure 72. The extent to which a mechanical layer 78 can extend over the support post 72 without resulting in an undesired amount of deflection will depend on a variety of factors, including but not limited to the thickness and rigidity of the various layers, particularly the support post, and the operating temperature of the MEMS device. In the illustrated embodiment, it can be seen that the mechanical layer 78 does not overlay the lower transition 76b between the sloped sidewall portion 88 and the substantially flat base portion 90.

Figure 10B:
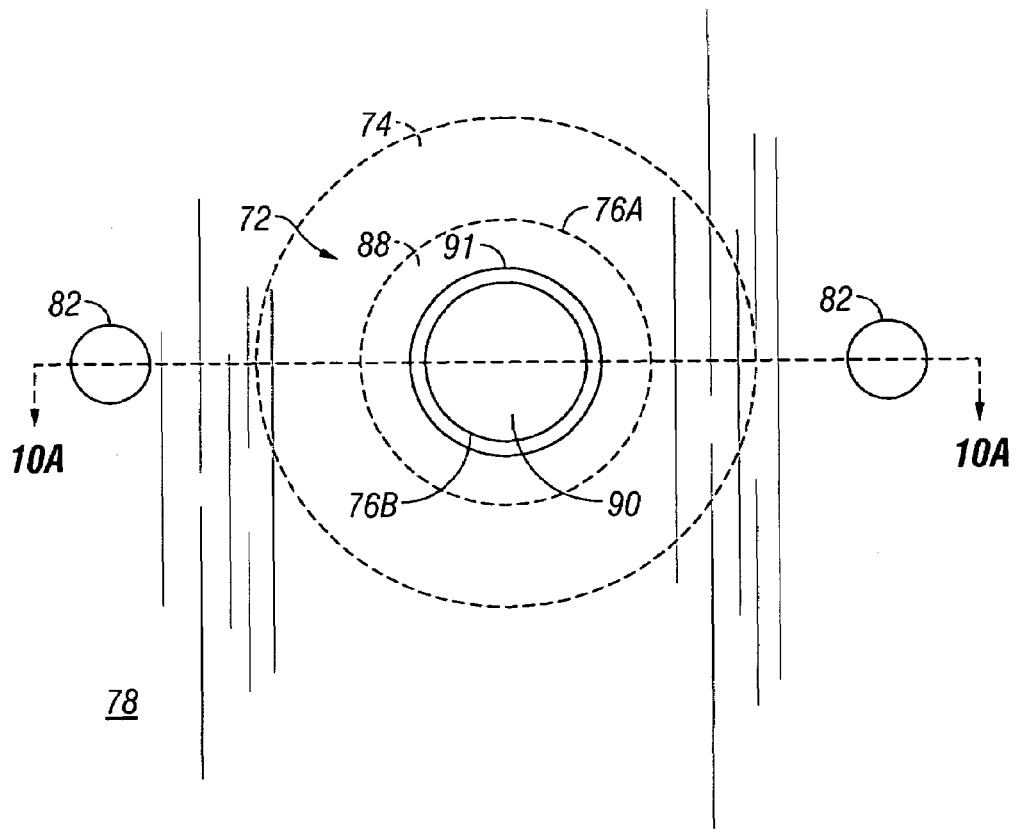
FIG. 10B is a top plan view of the MEMS device of FIG. 10A.

FIG. 10B depicts an overhead view of the MEMS device of FIG. 10A. As can be seen, the mechanical layer 78 overlies the wing portion 74 and part of the sloped sidewall portion 88, while the aperture 91 in the mechanical layer 78 overlies the base 90 of the support structure 72. Thus, the upper transition 76a is covered by the mechanical layer 78 while the lower transition 76b is exposed by the aperture 91 in the mechanical layer 78.

Figure 11A:
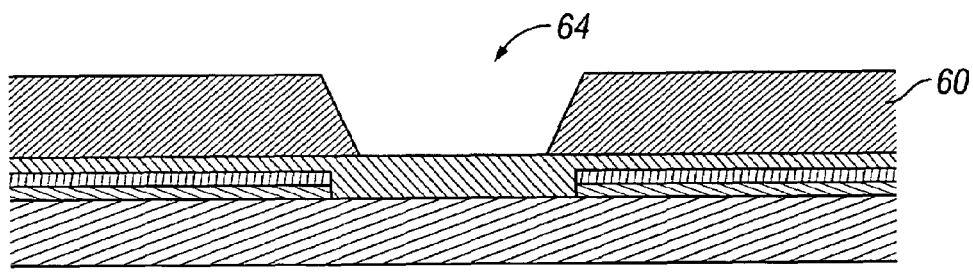
FIGS. 11A-11F are schematic cross-sections depicting certain alternate steps in the fabrication of an array of MEMS devices.

As discussed above, in another embodiment, the reflective layer may be deposited at a different point in the fabrication process. In one embodiment, a method for fabricating a MEMS device includes the steps described with respect to FIGS. 8A-8B. In FIG. 11A, it can be seen that a sacrificial layer 60 has been deposited over the dielectric layer, and patterned and etched to form apertures 64, which are preferably tapered as illustrated in the figure, as discussed above.

Figure 11B:
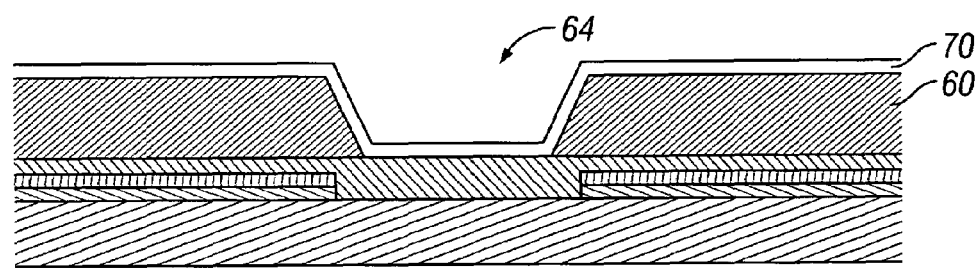

In FIG. 11B, it can be seen that a layer of post material 70 is deposited over the sacrificial layer 60. In certain embodiments, particularly those in which the post layer 70 is selectively etchable relative to the sacrificial layer 60, the post layer 70 may be deposited directly over the sacrificial layer 60. In other embodiments, however, an etch stop layer (not shown) may be deposited between the sacrificial layer 60 and the post layer 70, permitting the post layer 70 to be etched without substantially consuming the sacrificial layer 60. In certain embodiments, the etch stop layer may be left in the finished MEMS device, but in other embodiments, in the etch stop layer may be removed, usually during or after the release etch.

Figure 11C:
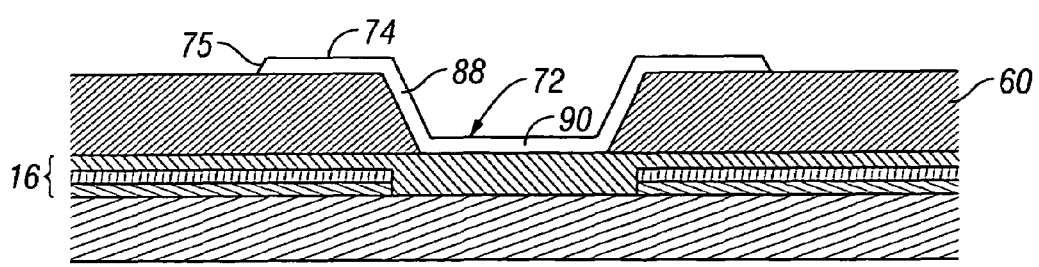

In FIG. 11C, the post layer 70 is patterned and etched as discussed above to create post structures 72. In the illustrated embodiment, the support structures 72 comprise a substantially flat base portion 90, a sloped sidewall portion 88, and a substantially horizontal wing portion 74 extending around the periphery of the support structure 72. It can also be seen that in the illustrated embodiments, the outer edge 75 of the wing portion 74 is tapered.

Figure 11D:
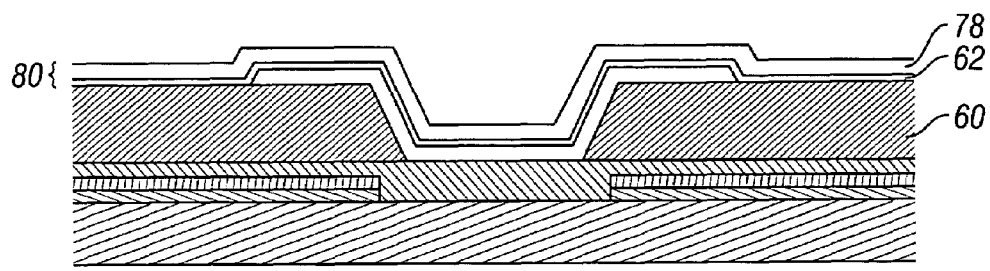

In FIG. 11D, a reflective layer 62 and mechanical layer 78 have been deposited over the support structure 72. In contrast to the device of FIG. 8H, it can be seen that the partially fabricated device of FIG. 11D will not include a reflective surface on the underside of the wing portion 74 of the support structure 72. In certain embodiments, this may be desirable, as the portion of the reflective layer 62 located underneath the wing portion 74 in FIG. 8H will generally remain at a substantially fixed distance from the partially reflective layer 54, even when the deformable reflective layer or electrode 80 is in an actuated position. This may result in undesirable optical interference.

Figure 11E:
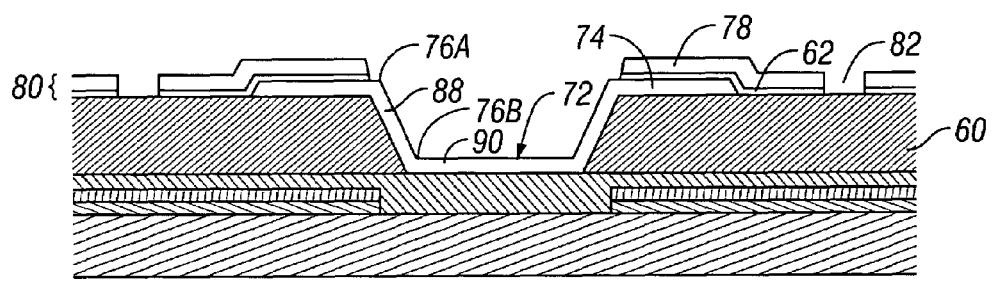

In FIG. 11E, the mechanical layer 78 is patterned and etched as discussed above with respect to FIG. 9B, removing those portions of the mechanical layer 78 that overlie the sloped sidewall portion 88 and base 90 of the support structure 72, as well as forming etch holes 82 extending through the mechanical layer 78. Both the upper transition 76a and the lower transition 76b are thus exposed. The reflective layer 72 is also patterned and etched, removing those portions of the reflective layer 72 exposed by the removal of the portions of the mechanical layer 78, and exposing portions of the underlying sacrificial layer 60.

Figure 11F:
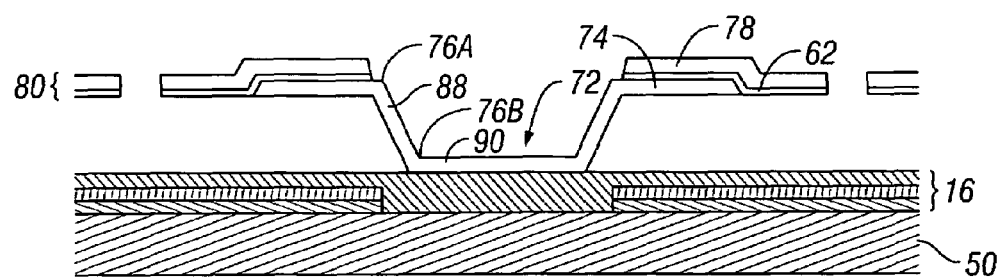

Finally, in FIG. 11F, the sacrificial layer 60 (see FIG. 11E) is removed. A released MEMS device is thus formed, in which a support post 72 has a wing portion 74 extending around the edges of the support post 72 and supporting the overlying reflective layer 62 and mechanical layer 78. As can be seen in both this embodiment and the embodiment of FIG. 9C, the MEMS devices further comprise a portion of the reflective layer 62 located either over or underneath the wing portion 74 of the support structure 72. While this portion of the reflective layer 62 may contribute to the stress mismatch, in both embodiments, the thickness of the reflective layer 62 will generally be thin relative to the thicknesses of the support post 72 and mechanical layer 78, such that even in embodiments (not pictured) in which the reflective layer 62 extends either over or under the sloped sidewall region 88 or base 90, the amount of deflection caused by this stress mismatch will be negligible. Thus, because the reflective layer may be thin relative to the surrounding layers, in certain embodiments, the reflective layer may remain over the upper surface of the support structure, while portions of the mechanical layer overlying the reflective layer and the post are removed. In certain other embodiments, either a portion of the reflective layer or a portion of both the reflective layer and the mechanical layer may extend at least partially down the sloped sidewall portion 88 of the support post 74, similar to the embodiments discussed with respect to FIGS. 10A and 10B.

Various modifications may be made to the above process flows. In particular, depending on the composition of the various layers and the etches used, the order in which certain layers are deposited can be varied. It will also be recognized that the order of layers and the materials forming those layers in the above embodiments are merely exemplary. In addition, although in the illustrated embodiment, the support structures are generally depicted as round or having rounded corners, in alternate embodiments the support structures may have different shapes. Moreover, in some embodiments, other layers, not shown, may be deposited and processed to form portions of a MEMS device or to form other structures on the substrate. In other embodiments, these layers may be formed using alternative deposition, patterning, and etching materials and processes, may be deposited in a different order, or composed of different materials, as would be known to one of skill in the art.

It is also to be recognized that, depending on the embodiment, the acts or events of any methods described herein can be performed in other sequences, may be added, merged, or left out altogether (e.g., not all acts or events are necessary for the practice of the methods), unless the text specifically and clearly states otherwise.

For example, in other embodiments, the processes and structures described above with respect to FIGS. 9A-10F may be used in conjunction with the embodiments of FIGS. 1-7E, and in particular the various interferometric modulator structures described with respect to those figures. In other embodiments, the processes and structures described above may be used in conjunction with MEMS devices which need not have the optical properties described above, such as MEMS switches.

While the above detailed description has shown, described, and pointed out novel features of the invention as applied to various embodiments, it will be understood that various omissions, substitutions, and changes in the form and details of the device of process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A MEMS device, comprising:
    an electrode layer located over a substrate;
    at least one support structure; and
    a mechanical layer located over said support structure and spaced apart from the electrode layer by a cavity, the mechanical layer comprising an aperture extending through said mechanical layer and overlying a central portion of the support structure, the aperture being surrounded by an annular section of the mechanical layer which extends about the periphery of the support structure and overlies the support structure.

2. The device of claim 1, wherein the support structure comprises a substantially horizontal wing portion extending around the periphery of the support structure.

3. The device of claim 2, wherein the mechanical layer overlies only the substantially horizontal wing portion of the support structures.

4. The MEMS device of claim 1, additionally comprising a reflective layer located under the mechanical layer.

5. The MEMS device of claim 2, wherein the reflective layer extends underneath a portion of the support structure.

6. The MEMS device of claim 4, wherein the reflective layer extends over a portion of the support structure.

7. The MEMS device of claim 4, wherein the reflective layer comprises Al.

8. The MEMS device of 2, additionally comprising a partially reflective layer located over the substrate.

9. The MEMS device of claim 8, wherein the partially reflective layer is located over the electrode layer.

10. The MEMS device of claim 1, additionally comprising a dielectric layer located over the electrode layer.

11. The MEMS device of claim 2, wherein the support structure comprises a sloped sidewall portion located in the interior of the support structure, and a transition between said sloped sidewall portion and the horizontal wing portion.

12. The MEMS device of claim 11, wherein the mechanical layer does not overlie the transition between the sloped sidewall portion and the horizontal wing portion.

13. The MEMS device of claim 11, wherein the mechanical layer overlies the transition between the sloped sidewall portion and the horizontal wing portion.

14. The MEMS device of claim 11, wherein the support structure comprises a substantially flat base portion, and wherein the aperture in the mechanical layer exposes the transition between the sloped sidewall portion and the substantially flat base portion.

15. The MEMS device of claim 1, additionally comprising:
a processor that is configured to communicate with at least one of said electrode layer and said mechanical layer, said processor being configured to process image data; and
a memory device that is configured to communicate with said processor.

16. The MEMS device of claim 15, further comprising a driver circuit configured to send at least one signal to at least one of said electrode layer and said mechanical layer.

17. The MEMS device of claim 16, further comprising a controller configured to send at least a portion of the image data to the driver circuit.

18. The MEMS device of claim 15, further comprising an image source module configured to send said image data to said processor.

19. The MEMS device of claim 18, wherein the image source module comprises at least one of a receiver, transceiver, and transmitter.

20. The MEMS device of claim 15, further comprising an input device configured to receive input data and to communicate said input data to said processor.

21. An MEMS device, comprising:
an electrode layer located over a substrate;
at least one support structure;
a mechanical layer located over said support structure and spaced apart from the electrode layer by a cavity, the mechanical layer comprising an aperture overlying at least a portion of the support structure, wherein an annular section of the mechanical layer that is defined by the aperture extends about the periphery of the support structure and overlies the support structure; and
a reflective layer located under the mechanical layer, wherein the reflective layer extends underneath a portion of the support structures.

22. An MEMS device, comprising:
an electrode layer located over a substrate;
at least one support structure, wherein the support structure comprises a substantially horizontal wing portion extending wound the periphery of the support structure, a sloped sidewall portion located in the interior of the support structure and a transition between said sloped sidewall portion and the horizontal wing portion, and a substantially flat base portion; and
a mechanical layer located over said support structure and spaced apart from the electrode layer by a cavity, the mechanical layer comprising an aperture overlying at least a portion of the support structure, wherein an annular section of the mechanical layer that is defined by the aperture extends about the periphery of the support structure and overlies the support structure, and wherein the aperture in the mechanical layer exposes the transition between the sloped sidewall portion and the substantially flat base portion.

* * * * *